United States Patent
Hosono et al.

(10) Patent No.: US 8,854,896 B2
(45) Date of Patent: Oct. 7, 2014

(54) NONVOLATILE SEMICONDUCTOR MEMORY DEVICE

(71) Applicant: Kabushiki Kaisha Toshiba, Tokyo (JP)

(72) Inventors: Koji Hosono, Kanagawa (JP); Toshifumi Shano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

(21) Appl. No.: 13/785,666

(22) Filed: Mar. 5, 2013

(65) Prior Publication Data

US 2014/0098612 A1 Apr. 10, 2014

(30) Foreign Application Priority Data

Oct. 5, 2012 (JP) ................................ 2012-223507

(51) Int. Cl.
| | | |
|---|---|---|
| *G11C 8/08* | (2006.01) | |
| *G11C 16/30* | (2006.01) | |
| *G11C 16/08* | (2006.01) | |
| *G11C 16/26* | (2006.01) | |
| *G11C 11/4074* | (2006.01) | |
| *G11C 5/14* | (2006.01) | |
| *G11C 16/24* | (2006.01) | |
| G11C 16/04 | (2006.01) | |
| G11C 7/00 | (2006.01) | |

(52) U.S. Cl.
CPC ................ *G11C 16/24* (2013.01); *G11C 16/08* (2013.01); *G11C 16/0483* (2013.01); *G11C 8/08* (2013.01); *G11C 5/147* (2013.01); *G11C 7/00* (2013.01)
USPC ............ 365/185.23; 365/185.17; 365/185.18; 365/189.09; 365/230.06

(58) Field of Classification Search
CPC ............ G11C 5/147; G11C 7/00; G11C 8/08; G11C 16/0483
USPC ............. 365/185.17, 185.18, 185.23, 189.09, 365/230.06
See application file for complete search history.

(56) References Cited

U.S. PATENT DOCUMENTS

| | | | |
|---|---|---|---|
| 7,561,468 B2 | 7/2009 | Hosono | |
| 2010/0034028 A1 | 2/2010 | Katsumata et al. | |
| 2010/0097858 A1 | 4/2010 | Tokiwa et al. | |
| 2010/0118610 A1 | 5/2010 | Katsumata et al. | |
| 2012/0243309 A1* | 9/2012 | Asaoka et al. ................ 365/182 |

FOREIGN PATENT DOCUMENTS

| | | |
|---|---|---|
| JP | 2009-205728 A | 9/2009 |
| JP | 2010-102755 | 5/2010 |
| JP | 2010-118530 | 5/2010 |

* cited by examiner

*Primary Examiner* — Ly D Pham
(74) *Attorney, Agent, or Firm* — Patterson & Sheridan, LLP

(57) ABSTRACT

A nonvolatile semiconductor memory device comprises multiple memory strings each including a plurality of first and second groups of serially connected memory cells, and a back gate transistor serially connected between the first and second groups of memory cells, a plurality of word lines, each word line being connected to a control gate of a different memory cell in each of the memory strings, a voltage generating circuit configured to generate control voltages of different voltage levels, and a control circuit configured to control application of control voltages to the word lines and the back gate line. A control voltage applied to the back gate line may be varied depending on how far a selected word line is from the back gate line, and a control voltage applied to unselected word lines may be varied depending on how far the unselected word line is from the selected word line.

20 Claims, 24 Drawing Sheets

COLUMN DECODER (WL0)

ONLY THE BIT LINE BL0 IS MARKED

COLUMN DECODER (WL0)

ONLY THE BIT LINE BL0 IS MARKED

Fig. 6A

| | DS | 0 | 1 | 2 | 3 | BG | 4 | 5 | 6 | 7 | DD |
|---|---|---|---|---|---|---|---|---|---|---|---|
| DD | VM1 | VM1 | VM1 | VM1 | VM1 | VM1 | VM1 | VM1 | VM1 | VM1 | Vpgm |
| 7 | VM1 | VM1 | VM1 | VM1 | VM1 | VM1 | VM1 | VM1 | VM1 | Vpgm | VM1 |
| 6 | VM1 | VM1 | VM1 | VM1 | VM1 | VM1 | VM1 | VM1 | Vpgm | VM1 | VM1 |
| 5 | VM1 | VM1 | VM1 | VM1 | VM1 | VM1 | VM1 | Vpgm | VM1 | VM1 | VM1 |
| 4 | VM1 | VM1 | VM1 | VM1 | VM1 | VM1 | Vpgm | VM1 | VM1 | VM1 | VM1 |
| BG | VBG1 | VBG1 | VBG1 | VBG1 | VBG2 | Vpgm | VBG2 | VBG1 | VBG1 | VBG1 | VBG1 |
| 3 | VM1 | VM1 | VM1 | VM1 | Vpgm | VM1 | VM1 | VM1 | VM1 | VM1 | VM1 |
| 2 | VM1 | VM1 | VM1 | Vpgm | VM1 | VM1 | VM1 | VM1 | VM1 | VM1 | VM1 |
| 1 | VM1 | VM1 | Vpgm | VM1 | VM1 | VM1 | VM1 | VM1 | VM1 | VM1 | VM1 |
| 0 | VM1 | Vpgm | VM1 | VM1 | VM1 | VM1 | VM1 | VM1 | VM1 | VM1 | VM1 |
| DS | Vpgm | VM1 | VM1 | VM1 | VM1 | VM1 | VM1 | VM1 | VM1 | VM1 | VM1 |

(b) column 1, (c) column 3

Fig. 6B

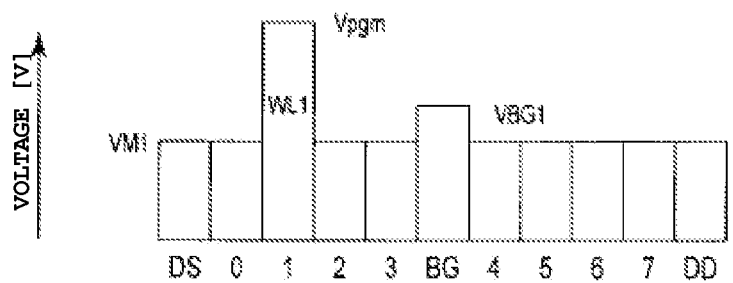

SELECTION OF WL1

Fig. 6C

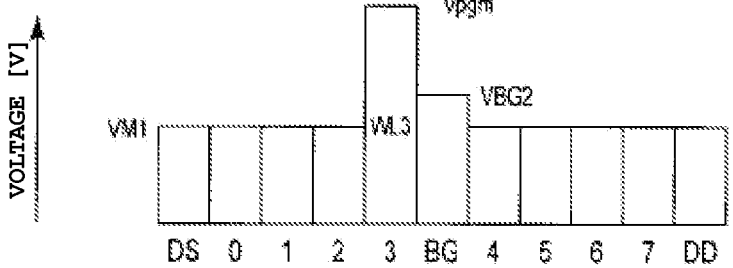

SELECTION OF WL3

→ increasing voltage

SECTIONAL DRAWING OF MEMORY STRING

Fig. 8A

|     |      |      | (b)  | (c)  | (d)  |      |      |      |      |      |      |
| --- | ---- | ---- | ---- | ---- | ---- | ---- | ---- | ---- | ---- | ---- | ---- |
| DD  | VM1  | VM1  | VM1  | VM1  | VM1  | VM1  | VM1  | VM1  | VM1  | VM1  | Vpgm |
| 7   | VM1  | VM1  | VM1  | VM1  | VM1  | VM1  | VM1  | VM1  | VM1  | Vpgm | VM1  |
| 6   | VM1  | VM1  | VM1  | VM1  | VM1  | VM1  | VM1  | VM1  | Vpgm | VM1  | VM1  |
| 5   | VM1  | VM1  | VM1  | VM1  | VM1  | VM1  | VM1  | Vpgm | VM1  | VM1  | VM1  |
| 4   | VM1  | VM1  | VM1  | VM1  | VM1  | VM1  | Vpgm | VM1  | VM1  | VM1  | VM1  |
| BG  | VBG1 | VBG1 | VBG1 | VBG2 | VBG3 | Vpgm | VBG3 | VBG2 | VBG1 | VBG1 | VBG1 |
| 3   | VM1  | VM1  | VM1  | VM1  | Vpgm | VM1  | VM1  | VM1  | VM1  | VM1  | VM1  |
| 2   | VM1  | VM1  | VM1  | Vpgm | VM1  | VM1  | VM1  | VM1  | VM1  | VM1  | VM1  |
| 1   | VM1  | VM1  | Vpgm | VM1  | VM1  | VM1  | VM1  | VM1  | VM1  | VM1  | VM1  |
| 0   | VM1  | Vpgm | VM1  | VM1  | VM1  | VM1  | VM1  | VM1  | VM1  | VM1  | VM1  |
| DS  | Vpgm | VM1  | VM1  | VM1  | VM1  | VM1  | VM1  | VM1  | VM1  | VM1  | VM1  |
|     | DS   | 0    | 1    | 2    | 3    | BG   | 4    | 5    | 6    | 7    | DD   |

Fig. 8B

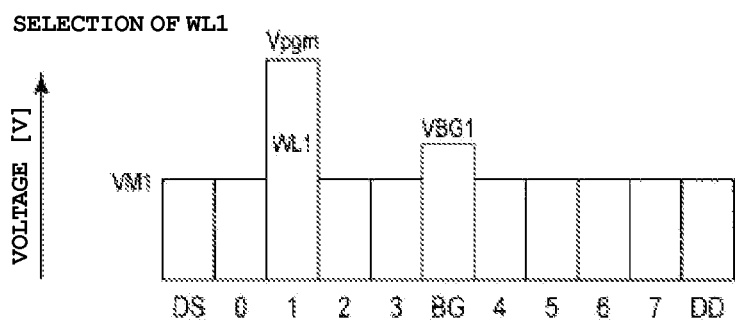

SELECTION OF WL1

Fig. 8C

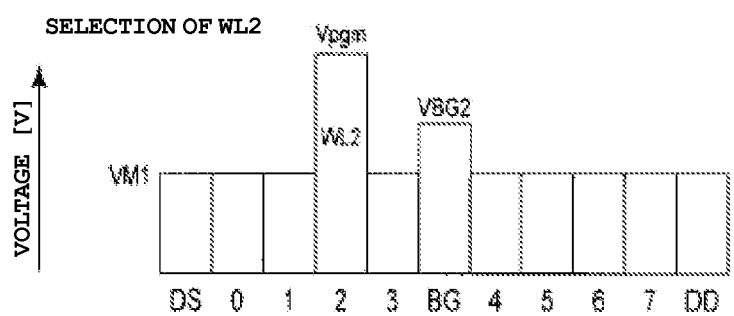

SELECTION OF WL2

Fig. 8D
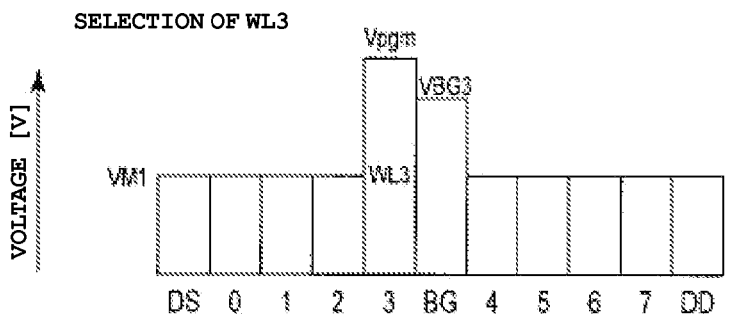
Fig. 9A
| | | | (b) | | (c) | | | | | | |
|---|---|---|---|---|---|---|---|---|---|---|---|
| DD | VM2 | VM2 | VM2 | VM2 | VM2 | VM2 | VM2 | VM2 | VM1 | Vpgm | |
| 7 | VM2 | VM2 | VM2 | VM2 | VM2 | VM2 | VM2 | VM1 | Vpgm | VM1 | |
| 6 | VM2 | VM2 | VM2 | VM2 | VM2 | VM2 | VM1 | Vpgm | VM1 | VM2 | |
| 5 | VM2 | VM2 | VM2 | VM2 | VM2 | VM1 | Vpgm | VM1 | VM2 | VM2 | |
| 4 | VM2 | VM2 | VM2 | VM2 | VM1 | VM1 | Vpgm | VM1 | VM2 | VM2 | VM2 |
| BG | VBG1 | VBG1 | VBG1 | VBG1 | VBG2 | Vpgm | VBG2 | VBG1 | VBG1 | VBG1 | VBG1 |
| 3 | VM2 | VM2 | VM2 | VM1 | Vpgm | VM1 | VM1 | VM2 | VM2 | VM2 | VM2 |
| 2 | VM2 | VM2 | VM1 | Vpgm | VM1 | VM2 | VM2 | VM2 | VM2 | VM2 | VM2 |
| 1 | VM2 | VM1 | Vpgm | VM1 | VM2 | VM2 | VM2 | VM2 | VM2 | VM2 | VM2 |
| 0 | VM1 | Vpgm | VM1 | VM2 | VM2 | VM2 | VM2 | VM2 | VM2 | VM2 | VM2 |
| DS | Vpgm | VM1 | VM2 | VM2 | VM2 | VM2 | VM2 | VM2 | VM2 | VM2 | VM2 |
| | DS | 0 | 1 | 2 | 3 | BG | 4 | 5 | 6 | 7 | DD |
Fig. 9B
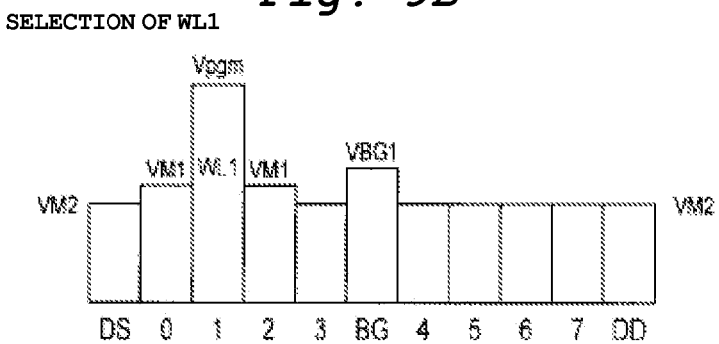

Fig. 9C
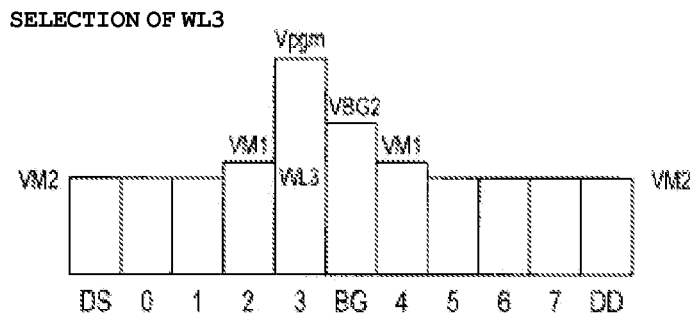
Fig. 10A
| | DS | 0 | 1 | 2 | 3 | BG | 4 | 5 | 6 | 7 | DD |
|---|---|---|---|---|---|---|---|---|---|---|---|
| DD | VM2 | VM2 | VM2 | VM2 | VM2 | VM2 | VM2 | VM2 | VM2 | VM1 | Vpgm |
| 7 | VM2 | VM2 | VM2 | VM2 | VM2 | VM2 | VM2 | VM2 | VM1 | Vpgm | VM1 |
| 6 | VM2 | VM2 | VM2 | VM2 | VM2 | VM2 | VM2 | VM1 | Vpgm | VM1 | VM2 |
| 5 | VM2 | VM2 | VM2 | VM2 | VM2 | VM2 | VM1 | Vpgm | VM1 | VM2 | VM2 |
| 4 | VM2 | VM2 | VM2 | VM2 | VM2 | VM1 | Vpgm | VM1 | VM2 | VM2 | VM2 |
| BG | VBG1 | VBG1 | VBG1 | VBG1 | VBG2 | Vpgm | VBG2 | VBG1 | VBG1 | VBG1 | VBG1 |
| 3 | VM2 | VM2 | VM2 | VM1 | Vpgm | VM1 | VM2 | VM2 | VM2 | VM2 | VM2 |
| 2 | VM2 | VM2 | VM1 | Vpgm | VM1 | VM2 | VM2 | VM2 | VM2 | VM2 | VM2 |
| 1 | VM2 | VM1 | Vpgm | VM1 | VM2 | VM2 | VM2 | VM2 | VM2 | VM2 | VM2 |
| 0 | VM1 | Vpgm | VM1 | VM2 | VM2 | VM2 | VM2 | VM2 | VM2 | VM2 | VM2 |
| DS | Vpgm | VM1 | VM2 | VM2 | VM2 | VM2 | VM2 | VM2 | VM2 | VM2 | VM2 |
| | DS | 0 | 1 | 2 | 3 | BG | 4 | 5 | 6 | 7 | DD |
Fig. 10B
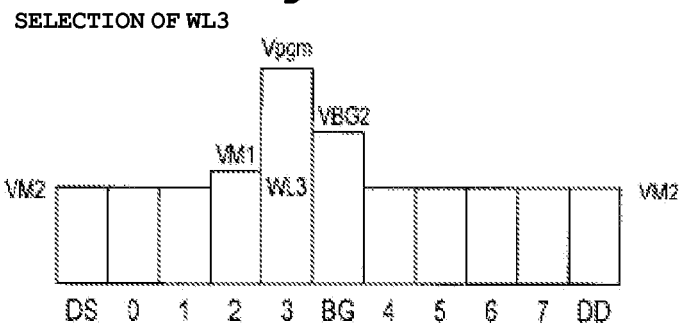

Fig. 10C

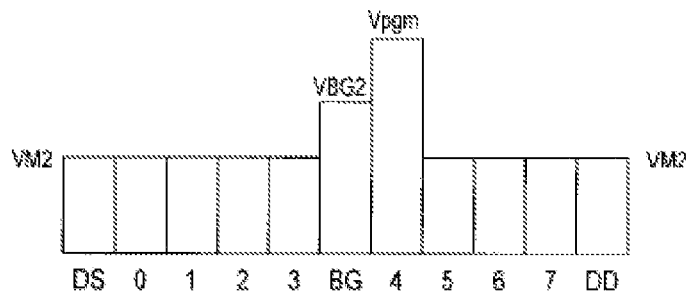

SELECTION OF WL4

Fig. 11A

| | | | (b) | (c) | (d) | | | | | | |
|---|---|---|---|---|---|---|---|---|---|---|---|
| DD | VM2 | VM2 | VM2 | VM2 | VM2 | VM2 | VM2 | VM2 | VM2 | VM1 | Vpgm |
| 7 | VM2 | VM2 | VM2 | VM2 | VM2 | VM2 | VM2 | VM2 | VM1 | Vpgm | VM1 |
| 6 | VM2 | VM2 | VM2 | VM2 | VM2 | VM2 | VM2 | VM1 | Vpgm | VM1 | VM2 |
| 5 | VM2 | VM2 | VM2 | VM2 | VM2 | VM2 | VM1 | Vpgm | VM1 | VM2 | VM2 |
| 4 | VM2 | VM2 | VM2 | VM2 | VM1 | VM1 | Vpgm | VM1 | VM2 | VM2 | VM2 |
| BG | VBG1 | VBG1 | VBG1 | VBG2 | VBG3 | Vpgm | VBG3 | VBG2 | VBG1 | VBG1 | VBG1 |
| 3 | VM2 | VM2 | VM2 | VM1 | Vpgm | VM1 | VM1 | VM2 | VM2 | VM2 | VM2 |
| 2 | VM2 | VM2 | VM1 | Vpgm | VM1 | VM2 | VM2 | VM2 | VM2 | VM2 | VM2 |
| 1 | VM2 | VM1 | Vpgm | VM1 | VM2 | VM2 | VM2 | VM2 | VM2 | VM2 | VM2 |
| 0 | VM1 | Vpgm | VM1 | VM2 | VM2 | VM2 | VM2 | VM2 | VM2 | VM2 | VM2 |
| DS | Vpgm | VM1 | VM2 | VM2 | VM2 | VM2 | VM2 | VM2 | VM2 | VM2 | VM2 |
| | DS | 0 | 1 | 2 | 3 | BG | 4 | 5 | 6 | 7 | DD |

Fig. 11B

SELECTION OF WL1

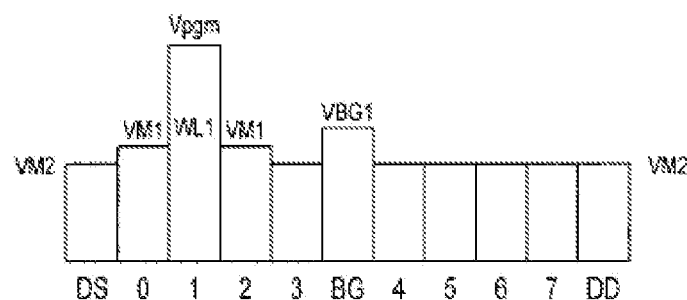

Fig. 11C

SELECTION OF WL2

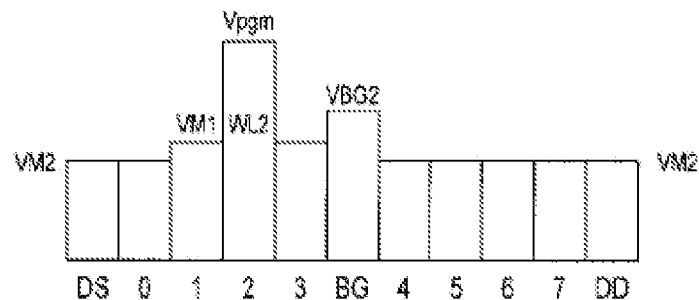

Fig. 11D

SELECTION OF WL3

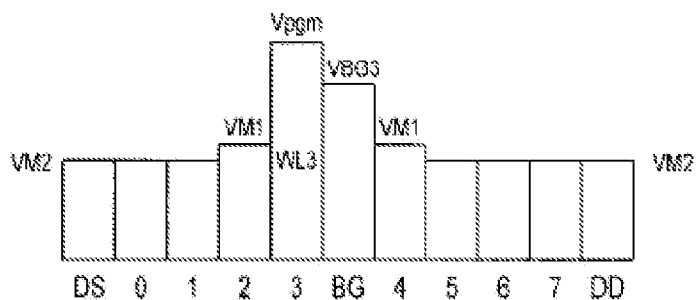

Fig. 12A

| DD | VM2 | VM2 | VM2 | VM2 | VM2 | VM2 | VM2 | VM2 | VM1 | Vpgm |
|---|---|---|---|---|---|---|---|---|---|---|
| 7 | VM2 | VM2 | VM2 | VM2 | VM2 | VM2 | VM2 | VM2 | VM1 | Vpgm | VM1 |
| 6 | VM2 | VM2 | VM2 | VM2 | VM2 | VM2 | VM2 | VM1 | Vpgm | VM1 | VM2 |
| 5 | VM2 | VM2 | VM2 | VM2 | VM2 | VM2 | VM1 | Vpgm | VM1 | VM2 | VM2 |
| 4 | VM2 | VM2 | VM2 | VM2 | VM2 | VM1 | Vpgm | VM1 | VM2 | VM2 | VM2 |
| BG | VBG1 | VBG1 | VBG1 | VBG2 | VBG3 | Vpgm | VBG3 | VBG2 | VBG1 | VBG1 | VBG1 |
| 3 | VM2 | VM2 | VM2 | VM1 | Vpgm | VM1 | VM2 | VM2 | VM2 | VM2 | VM2 |
| 2 | VM2 | VM2 | VM1 | Vpgm | VM1 | VM2 | VM2 | VM2 | VM2 | VM2 | VM2 |
| 1 | VM2 | VM1 | Vpgm | VM1 | VM2 | VM2 | VM2 | VM2 | VM2 | VM2 | VM2 |
| 0 | VM1 | Vpgm | VM1 | VM2 | VM2 | VM2 | VM2 | VM2 | VM2 | VM2 | VM2 |
| DS | Vpgm | VM1 | VM2 | VM2 | VM2 | VM2 | VM2 | VM2 | VM2 | VM2 | VM2 |
|  | DS | 0 | 1 | 2 | 3 | BG | 4 | 5 | 6 | 7 | DD |

Fig. 12B

SELECTION OF WL3

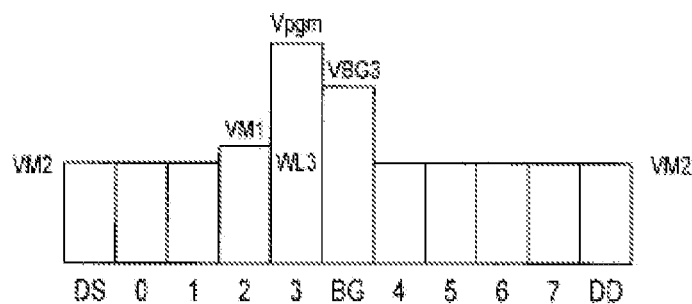

Fig. 12C

SELECTION OF WL3

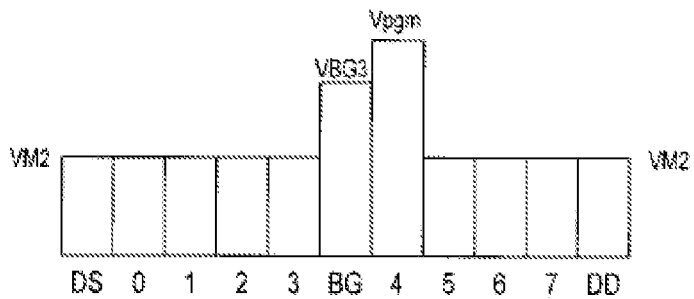

Fig. 13A

|     | DS   | 0    | 1    | 2    | 3    | BG   | 4    | 5    | 6    | 7    | DD   |
|-----|------|------|------|------|------|------|------|------|------|------|------|
| DD  | VM3  | VM3  | VM3  | VM3  | VM3  | VM3  | VM3  | VM3  | VM2  | VM1  | Vpgm |
| 7   | VM3  | VM3  | VM3  | VM3  | VM3  | VM3  | VM3  | VM2  | VM1  | Vpgm | VM1  |
| 6   | VM3  | VM3  | VM3  | VM3  | VM3  | VM3  | VM2  | VM1  | Vpgm | VM1  | VM2  |
| 5   | VM3  | VM3  | VM3  | VM3  | VM2  | VM2  | VM1  | Vpgm | VM1  | VM2  | VM3  |
| 4   | VM3  | VM3  | VM3  | VM2  | VM1  | VM1  | Vpgm | VM1  | VM2  | VM3  | VM3  |
| BG  | VBG1 | VBG1 | VBG1 | VBG1 | VBG2 | Vpgm | VBG2 | VBG1 | VBG1 | VBG1 | VBG1 |
| 3   | VM3  | VM3  | VM2  | VM1  | Vpgm | VM1  | VM1  | VM2  | VM3  | VM3  | VM3  |
| 2   | VM3  | VM2  | VM1  | Vpgm | VM1  | VM2  | VM2  | VM3  | VM3  | VM3  | VM3  |
| 1   | VM2  | VM1  | Vpgm | VM1  | VM2  | VM3  | VM3  | VM3  | VM3  | VM3  | VM3  |
| 0   | VM1  | Vpgm | VM1  | VM2  | VM3  | VM3  | VM3  | VM3  | VM3  | VM3  | VM3  |
| DS  | Vpgm | VM1  | VM2  | VM3  | VM3  | VM3  | VM3  | VM3  | VM3  | VM3  | VM3  |
|     | DS   | 0    | 1    | 2    | 3    | BG   | 4    | 5    | 6    | 7    | DD   |

SELECTION OF WL1

SELECTION OF WL2

SELECTION OF WL3

Fig. 14A

| | DS | 0 | 1 | 2 | 3 | BG | 4 | 5 | 6 | 7 | DD |
|---|---|---|---|---|---|---|---|---|---|---|---|
| DD | VM3 | VM3 | VM3 | VM3 | VM3 | VM3 | VM3 | VM3 | VM2 | VM1 | Vpgm |
| 7 | VM3 | VM3 | VM3 | VM3 | VM3 | VM3 | VM3 | VM2 | VM1 | Vpgm | VM1 |
| 6 | VM3 | VM3 | VM3 | VM3 | VM3 | VM3 | VM2 | VM1 | Vpgm | VM1 | VM2 |
| 5 | VM3 | VM3 | VM3 | VM3 | VM3 | VM2 | VM1 | Vpgm | VM1 | VM2 | VM3 |
| 4 | VM3 | VM3 | VM3 | VM2 | VM2 | VM1 | Vpgm | VM1 | VM2 | VM3 | VM3 |
| BG | VBG1 | VBG1 | VBG1 | VBG1 | VBG2 | Vpgm | VBG2 | VBG1 | VBG1 | VBG1 | VBG1 |
| 3 | VM3 | VM3 | VM2 | VM1 | Vpgm | VM1 | VM2 | VM2 | VM3 | VM3 | VM3 |
| 2 | VM3 | VM2 | VM1 | Vpgm | VM1 | VM2 | VM2 | VM3 | VM3 | VM3 | VM3 |
| 1 | VM2 | VM1 | Vpgm | VM1 | VM2 | VM3 | VM3 | VM3 | VM3 | VM3 | VM3 |
| 0 | VM1 | Vpgm | VM1 | VM2 | VM3 | VM3 | VM3 | VM3 | VM3 | VM3 | VM3 |
| DS | Vpgm | VM1 | VM2 | VM3 | VM3 | VM3 | VM3 | VM3 | VM3 | VM3 | VM3 |

Fig. 14B

SELECTION OF WL1

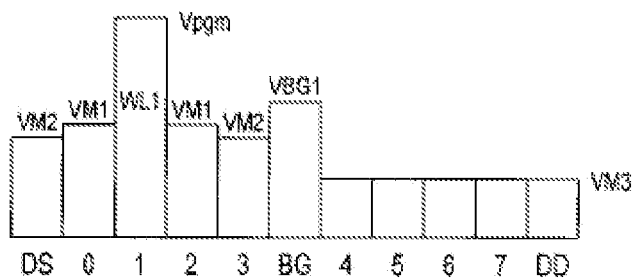

Fig. 14C

SELECTION OF WL2

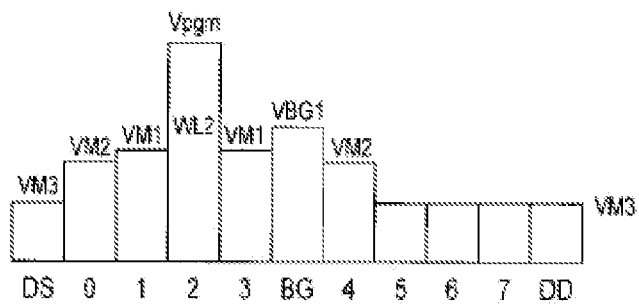

Fig. 14D

SELECTION OF WL3

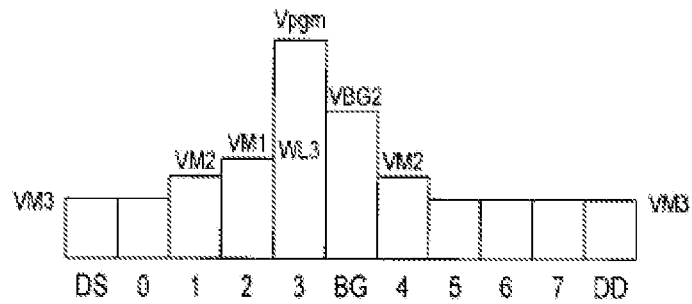

Fig. 15A

| DD | VM3 | VM3 | VM3 | VM3 | VM3 | VM3 | VM3 | VM3 | VM2 | VM1 | Vpgm |
|---|---|---|---|---|---|---|---|---|---|---|---|
| 7 | VM3 | VM3 | VM3 | VM3 | VM3 | VM3 | VM3 | VM2 | VM1 | Vpgm | VM1 |
| 6 | VM3 | VM3 | VM3 | VM3 | VM3 | VM3 | VM2 | VM1 | Vpgm | VM1 | VM2 |
| 5 | VM3 | VM3 | VM3 | VM3 | VM2 | VM2 | VM1 | Vpgm | VM1 | VM2 | VM3 |
| 4 | VM3 | VM3 | VM3 | VM2 | VM1 | VM1 | Vpgm | VM1 | VM2 | VM3 | VM3 |
| BG | VBG1 | VBG1 | VBG1 | VBG2 | VBG3 | Vpgm | VBG2 | VBG1 | VBG1 | VBG1 | VBG1 |
| 3 | VM3 | VM3 | VM2 | VM1 | Vpgm | VM1 | VM1 | VM2 | VM3 | VM3 | VM3 |
| 2 | VM3 | VM2 | VM1 | Vpgm | VM1 | VM2 | VM2 | VM3 | VM3 | VM3 | VM3 |
| 1 | VM2 | VM1 | Vpgm | VM1 | VM2 | VM3 | VM3 | VM3 | VM3 | VM3 | VM3 |
| 0 | VM1 | Vpgm | VM1 | VM2 | VM3 | VM3 | VM3 | VM3 | VM3 | VM3 | VM3 |
| DS | Vpgm | VM1 | VM2 | VM3 | VM3 | VM3 | VM3 | VM3 | VM3 | VM3 | VM3 |
|  | DS | 0 | 1 | 2 | 3 | BG | 4 | 5 | 6 | 7 | DD |

SELECTION OF WL1

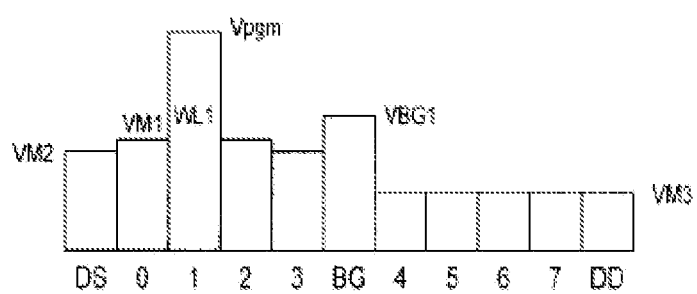

Fig. 15C

SELECTION OF WL2

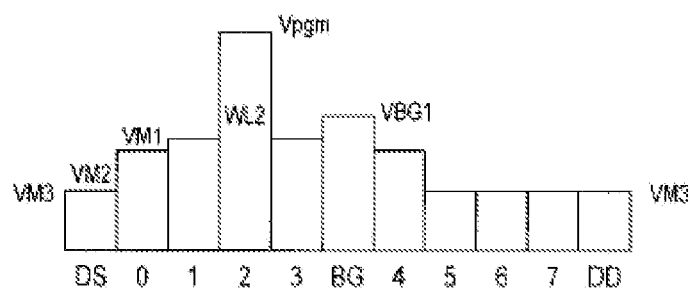

Fig. 15D

SELECTION OF WL3

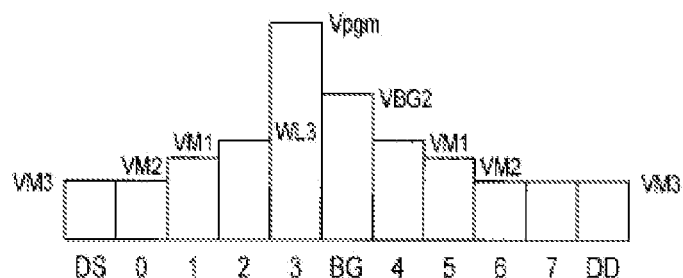

Fig. 16A

| | | | | | (b) | | (c) | | | |
|---|---|---|---|---|---|---|---|---|---|---|
| DD | VM3 | VM3 | VM3 | VM3 | VM3 | VM3 | VM3 | VM2 | VM1 | Vpgm |
| 7 | VM3 | VM3 | VM3 | VM3 | VM3 | VM3 | VM3 | VM2 | VM1 | Vpgm | VM1 |
| 6 | VM3 | VM3 | VM3 | VM3 | VM3 | VM3 | VM2 | VM1 | Vpgm | VM1 | VM2 |
| 5 | VM3 | VM3 | VM3 | VM3 | VM2 | VM2 | VM1 | Vpgm | VM1 | VM2 | VM3 |
| 4 | VM3 | VM3 | VM3 | VM2 | VM2 | VM1 | Vpgm | VM1 | VM2 | VM3 | VM3 |
| BG | VBG1 | VBG1 | VBG1 | VBG2 | VBG3 | Vpgm | VBG3 | VBG2 | VBG1 | VBG1 | VBG1 |
| 3 | VM3 | VM3 | VM2 | VM1 | Vpgm | VM1 | VM2 | VM2 | VM3 | VM3 | VM3 |
| 2 | VM3 | VM2 | VM1 | Vpgm | VM1 | VM2 | VM2 | VM3 | VM3 | VM3 | VM3 |
| 1 | VM2 | VM1 | Vpgm | VM1 | VM2 | VM3 | VM3 | VM3 | VM3 | VM3 | VM3 |
| 0 | VM1 | Vpgm | VM1 | VM2 | VM3 | VM3 | VM3 | VM3 | VM3 | VM3 | VM3 |
| DS | Vpgm | VM1 | VM2 | VM3 | VM3 | VM3 | VM3 | VM3 | VM3 | VM3 | VM3 |
| | DS | 0 | 1 | 2 | 3 | BG | 4 | 5 | 6 | 7 | DD |

Fig. 16B
SELECTION OF WL3
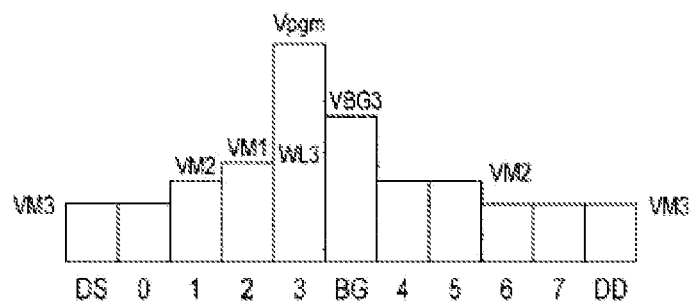
Fig. 16C
SELECTION OF WL4
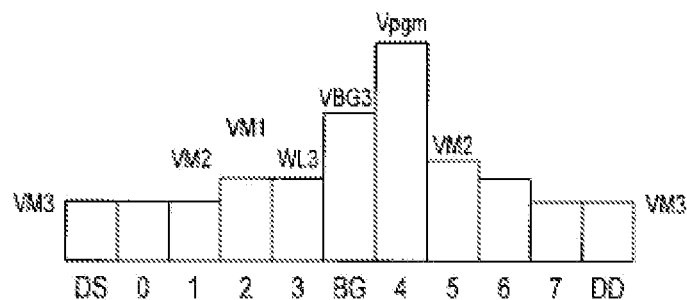
Fig. 17A

SELECTION OF WL1

SELECTION OF WL2

SELECTION OF WL3

Fig. 18A

|     | DS   | 0    | 1    | 2    | 3    | BG   | 4    | 5    | 6    | 7    | DD   |
|-----|------|------|------|------|------|------|------|------|------|------|------|
| DD  | VM2  | VM2  | VM2  | VM2  | VM2  | VM2  | VM2  | VM2  | VM2  | VM1  | Vpgm |
| 7   | VM2  | VM2  | VM2  | VM2  | VM2  | VM2  | VM2  | VM2  | VM1  | Vpgm | VM1  |
| 6   | VM2  | VM2  | VM2  | VM2  | VM2  | VM2  | VM2  | VM1  | Vpgm | VM1  | VM3  |
| 5   | VM2  | VM2  | VM2  | VM2  | VM2  | VM2  | VM1  | Vpgm | VM1  | VM3  | VM3  |
| 4   | VM2  | VM2  | VM2  | VM2  | VM2  | VM1  | Vpgm | VM1  | VM3  | VM3  | VM3  |
| BG  | VBG1 | VBG1 | VBG1 | VBG2 | VBG3 | Vpgm | VBG3 | VBG2 | VBG1 | VBG1 | VBG1 |
| 3   | VM2  | VM2  | VM2  | VM1  | Vpgm | VM1  | VM3  | VM3  | VM3  | VM3  | VM3  |
| 2   | VM2  | VM2  | VM1  | Vpgm | VM1  | VM3  | VM3  | VM3  | VM3  | VM3  | VM3  |
| 1   | VM2  | VM1  | Vpgm | VM1  | VM3  | VM3  | VM3  | VM3  | VM3  | VM3  | VM3  |
| 0   | VM1  | Vpgm | VM1  | VM3  | VM3  | VM3  | VM3  | VM3  | VM3  | VM3  | VM3  |
| DS  | Vpgm | VM1  | VM3  | VM3  | VM3  | VM3  | VM3  | VM3  | VM3  | VM3  | VM3  |

SELECTION OF WL1

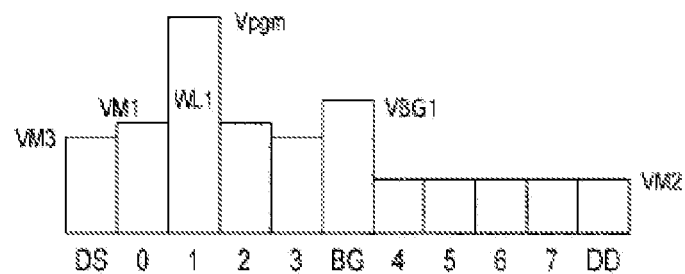

Fig. 18C

SELECTION OF WL2

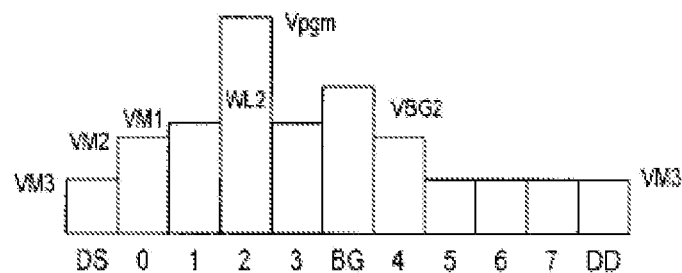

*Fig. 18D*
SELECTION OF WL3
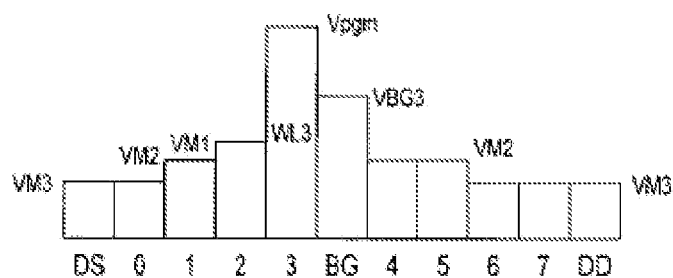
*Fig. 19A*
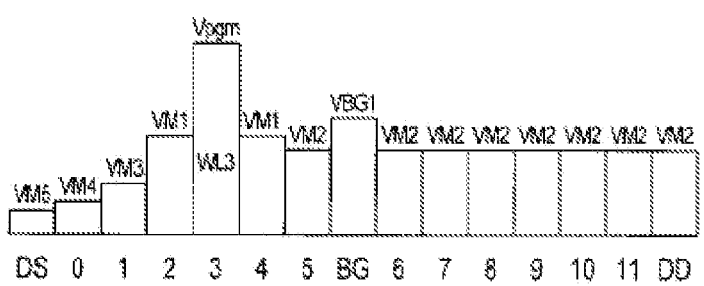
*Fig. 19B*
SELECTION OF WL3

Fig. 19C

SELECTION OF WL4

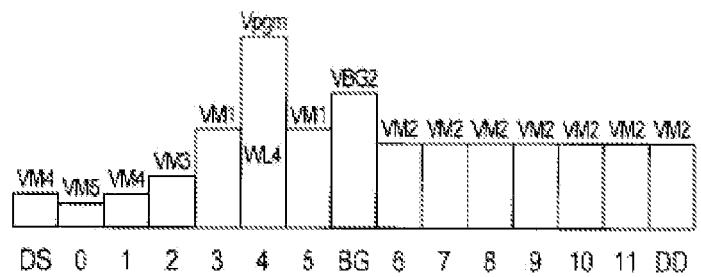

Fig. 19D

SELECTION OF WL5

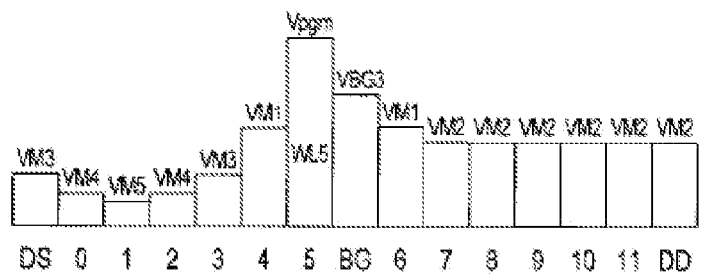

Fig. 20A

| | DS | 0 | 1 | 2 | 3 | 4 | 5 | BG | 6 | 7 | 8 | 9 | 10 | 11 | DD |
|---|---|---|---|---|---|---|---|---|---|---|---|---|---|---|---|
| DD | VM2 | VM2 | VM2 | VM2 | VM2 | VM2 | VM2 | VM2 | VM2 | VM2 | VM2 | VM2 | VM2 | VM1 | Vpgm |
| 11 | VM2 | VM2 | VM2 | VM2 | VM2 | VM2 | VM2 | VM2 | VM2 | VM2 | VM2 | VM2 | VM1 | Vpgm | VM1 |
| 10 | VM2 | VM2 | VM2 | VM2 | VM2 | VM2 | VM2 | VM2 | VM2 | VM2 | VM2 | VM1 | Vpgm | VM1 | VM3 |
| 9 | VM2 | VM2 | VM2 | VM2 | VM2 | VM2 | VM2 | VM2 | VM2 | VM2 | VM1 | Vpgm | VM1 | VM3 | VM4 |
| 8 | VM2 | VM2 | VM2 | VM2 | VM2 | VM2 | VM2 | VM2 | VM2 | VM1 | Vpgm | VM1 | VM3 | VM4 | VM5 |
| 7 | VM2 | VM2 | VM2 | VM2 | VM2 | VM2 | VM2 | VM2 | VM1 | Vpgm | VM1 | VM3 | VM4 | VM5 | VM4 |
| 6 | VM2 | VM2 | VM2 | VM2 | VM2 | VM2 | VM2 | VM1 | Vpgm | VM1 | VM3 | VM4 | VM5 | VM4 | VM3 |
| BG | VBG1 | VBG1 | VBG1 | VBG1 | VBG1 | VBG2 | VBG3 | Vpgm | VBG3 | VBG2 | VBG1 | VBG1 | VBG1 | VBG1 | VBG1 |
| 5 | VM2 | VM2 | VM2 | VM2 | VM2 | VM1 | Vpgm | VM1 | VM3 | VM4 | VM5 | VM4 | VM3 | VM3 | VM3 |
| 4 | VM2 | VM2 | VM2 | VM2 | VM1 | Vpgm | VM1 | VM3 | VM4 | VM5 | VM4 | VM3 | VM3 | VM3 | VM3 |
| 3 | VM2 | VM2 | VM2 | VM1 | Vpgm | VM1 | VM3 | VM4 | VM5 | VM4 | VM3 | VM3 | VM3 | VM3 | VM3 |
| 2 | VM2 | VM2 | VM1 | Vpgm | VM1 | VM3 | VM4 | VM5 | VM4 | VM3 | VM3 | VM3 | VM3 | VM3 | VM3 |
| 1 | VM2 | VM1 | Vpgm | VM1 | VM3 | VM4 | VM5 | VM4 | VM3 | VM3 | VM3 | VM3 | VM3 | VM3 | VM3 |
| 0 | VM1 | Vpgm | VM1 | VM3 | VM4 | VM5 | VM4 | VM3 | VM3 | VM3 | VM3 | VM3 | VM3 | VM3 | VM3 |
| DS | Vpgm | VM1 | VM3 | VM4 | VM5 | VM4 | VM3 | VM3 | VM3 | VM3 | VM3 | VM3 | VM3 | VM3 | VM3 |
| | DS | 0 | 1 | 2 | 3 | 4 | 5 | BG | 6 | 7 | 8 | 9 | 10 | 11 | DD |

SELECTION OF WL5

SELECTION OF WL6

NONVOLATILE SEMICONDUCTOR MEMORY DEVICE

CROSS-REFERENCE TO RELATED APPLICATION

This application is based upon and claims the benefit of priority from Japanese Patent Application No. 2012-223507, filed Oct. 5, 2012, the entire contents of which are incorporated herein by reference.

FIELD

The embodiments described herein relate to a nonvolatile semiconductor memory device and a method for controlling a back gate voltage therein.

BACKGROUND

In recent years, the layer-type semiconductor memory devices (e.g., BiCS: Bit Cost Scalable Flash Memory) in which groups of memory cells are arranged in layers, have been developed.

DESCRIPTION OF THE DRAWINGS

FIGS. 6A to 6C show voltages applied on the word lines according to the first embodiment.

FIGS. 8A to 8D show voltages applied on the word lines according to a second embodiment.

FIGS. 9A to 9C show voltages applied on the word lines according to a third embodiment.

FIGS. 10A to 10C show voltages applied on the word lines according to a fourth embodiment.

FIGS. 11A to 11D show voltages applied on the word lines according to a fifth embodiment.

FIGS. 12A to 12C show voltages applied on the word lines according to a sixth embodiment.

FIGS. 13A to 13D show voltages applied on the word lines according to a seventh embodiment.

FIGS. 14A to 14D show voltages applied on the word lines according to an eight embodiment.

FIGS. 15A to 15D show voltages applied on the word lines according to a ninth embodiment.

FIGS. 16A to 16C show voltages applied on the word lines according to a tenth embodiment.

FIGS. 17A to 17D show voltages applied on the word lines according to an eleventh embodiment.

FIGS. 18A to 18D show voltages applied on the word lines according to a twelfth embodiment.

FIGS. 19A to 19D show voltages applied on the word lines according to a thirteenth embodiment.

FIGS. 20A to 20C show voltages applied on the word lines according to a fourteenth embodiment.

DETAILED DESCRIPTION

Embodiments provide a nonvolatile semiconductor memory device capable of suppressing program disturbance.

In general, according to one embodiment, during the description, the same referent labels are used for the same structures throughout the figures; additionally, throughout the figures, the relationship between the size of the thickness of the plane, as well as the ratio of the thickness of each layer, is different across the figures and is different from the actual thicknesses and, therefore, the practical thickness and size are determined according to the following description.

A nonvolatile semiconductor memory device comprises multiple memory strings each including a plurality of first and second groups of serially connected memory cells, and a back gate transistor serially connected between the first and second groups of memory cells, a plurality of word lines, each word line being connected to a control gate of a different memory cell in each of the memory strings, a voltage generating circuit configured to generate control voltages of different voltage levels, and a control circuit configured to control application of control voltages to the word lines and the back gate line. A control voltage applied to the back gate line may be varied depending on how far a selected word line is from the back gate line, and a control voltage applied to unselected word lines may be varied depending on how far the unselected word line is from the selected word line.

First Embodiment

Figure 1:
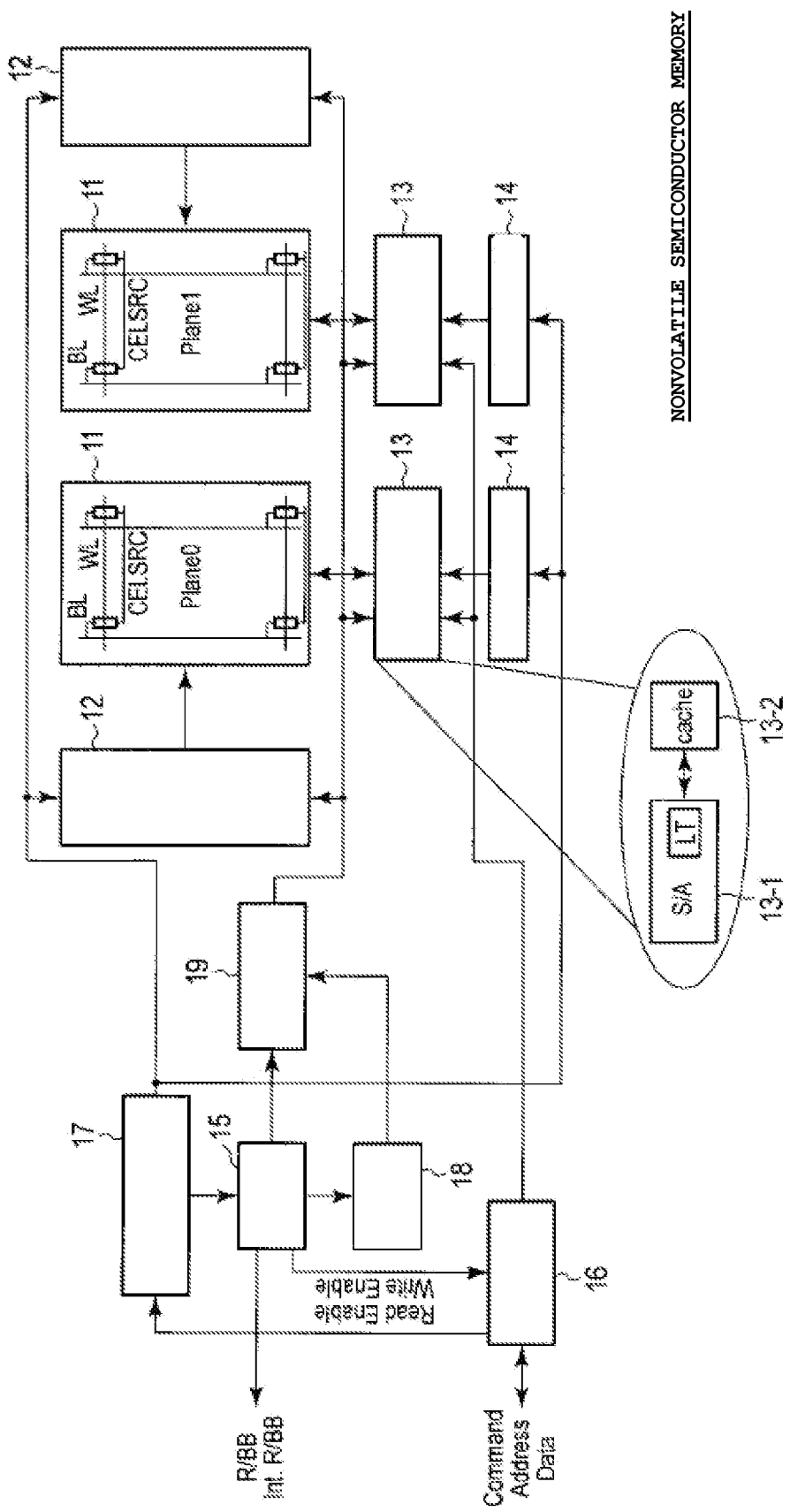
FIG. 1 is an example of a nonvolatile semiconductor memory device according to a first embodiment.

First, the structure of the nonvolatile semiconductor memory device according to the first embodiment is shown in FIG. 1, and FIG. 1 is block diagram of the nonvolatile semiconductor memory device according to the first embodiment.

As shown in FIG. 1, the nonvolatile semiconductor memory device according to the first embodiment includes memory cell array 11, row decoder 12, data circuit and page buffer 13, column decoder 14, control circuit 15, input-output circuit 16, address command register 17, internal voltage generating circuit 18 and CG line driver 19. A more detailed description of these components will be described later.

<Memory Cell Array 11>

As shown in FIG. 1, the memory cell array 11 has a plane P0 and a plane P1 (referenced as Plane0 and Plane1 in the drawing), and these planes each have multiple memory strings MS, which are respectively connected with a bit line BL, word lines WL and a source line CELSRC.

As will be explained later, the memory string MS have multiple memory cells MC, which are connected with the word lines WL through a control CG of the memory cell MC.

The amount of the planes in the memory cell array 11 is unlimited; furthermore, the plane is just described as plane P when there is no need to distinguish between plane P0 and plane P1.

The detail structure of the plane P is described in the following with reference to FIG. 2.

<Detail Structure of Plane P>

Figure 2:
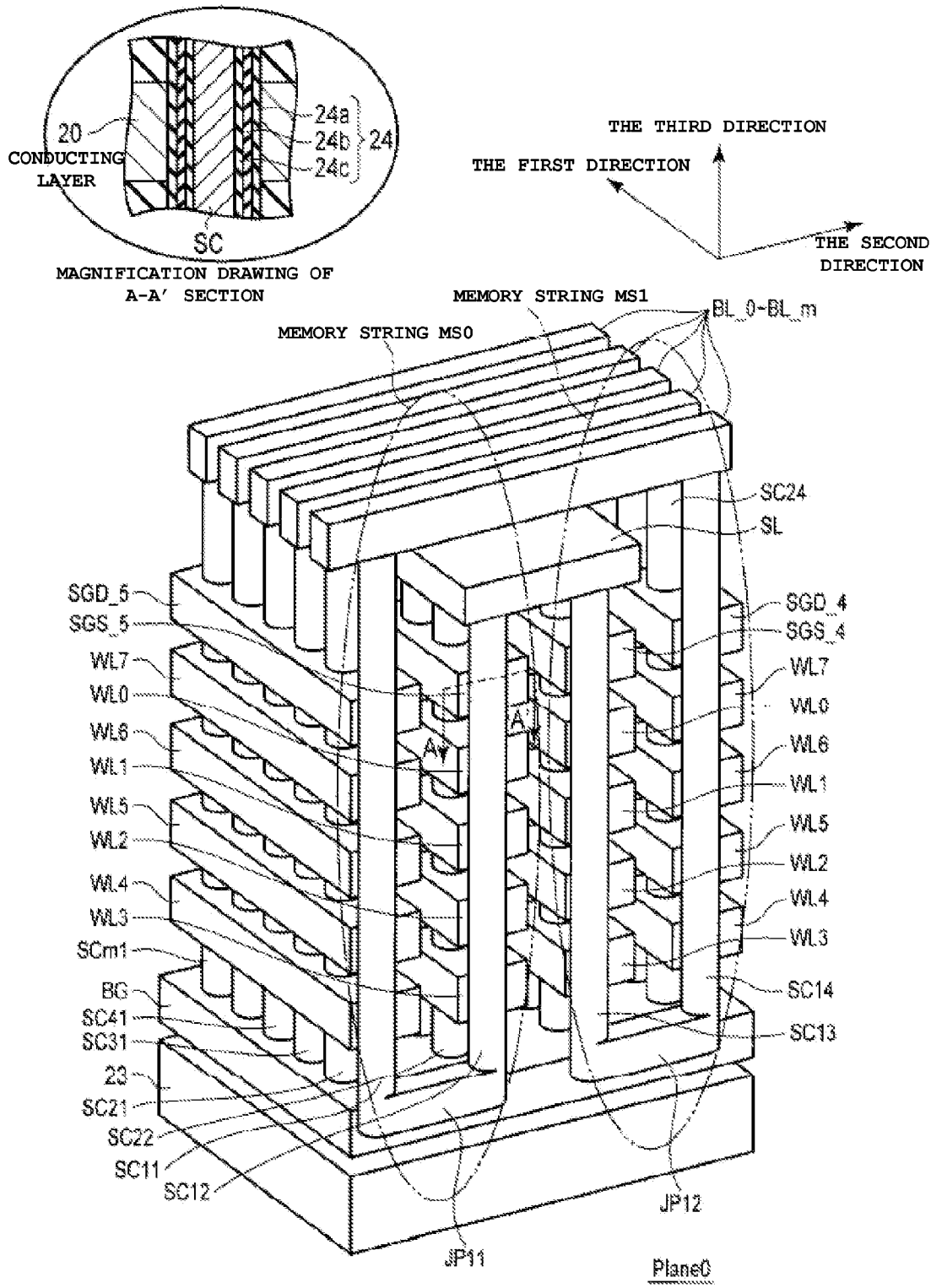
FIG. 2 is a perspective view of a memory cell array and a cross-sectional view of memory cells of the first embodiment.

FIG. 2 is a perspective view representing the structure of plane P in three dimensions; the plane P0 and the plane P1 have the same structure, so only the example of plane P0 is described.

As shown in FIG. 2, in the plane formed in the first direction and the second direction, the columnar semiconductor layer SC is formed as a matrix (5×4); the semiconductor layer SC is arranged on the conductive layer of the back gate BG and is formed in the third direction that is normal to the first direction and the second direction. Additionally, each semiconductor layer SC adjacent to each other in the second direction is joined by a joint part JP in the conductive layer of the back gate BG; the semiconductor layers SC adjacent to each other and the joint part JP form the U-shaped memory string MS.

Specifically, as in FIG. 2, the semiconductor layers SC11, SC12, SC13 and SC14 are formed in order from the surface in the second direction; more specifically, the semiconductor layer SC11 and the SC12 are connected by the joint part JP11 and form the memory string MS0 therefrom. Also, the semiconductor layer SC13 and SC14 are connected by the joint part JP12 and form the memory string MS1 therefrom.

In addition, these memory strings MS have the memory cells MC, the selection transistors ST1 and ST2, and a back gate transistor MCBG; the joint part JP works as channel region of transistor controlled by BG as.

Additional descriptions are omitted due to the fact that the other semiconductor layer groups including the semiconductor layers SC21 and SC22 and the semiconductor layers SC23 and SC24 abutted with the semiconductor layers SC11, SC12, SC13 and SC14 and formed in the first direction are of the same structure; in the deformation example, m=5 and n=4, but m and n may be any number.

Multiple semiconductor layers SC are formed in the third direction along with the word line WL formed in the first direction; and the memory cell is formed around the intersection between the word line WL and the semiconductor layer SC.

The enlarged drawing on the left upper part of FIG. 2 represents a section of the structure of the memory cell MC; the oxide layer 24c, the insulating layer (charge storage layer) 24b, and the insulating layer (block layer) 24a are formed in order along the plane in the first direction and the second direction from the surface of the semiconductor layer SC. The insulating layer 24a is formed a material having a higher dielectric constant (usually named high-k) than that of gate oxide film 24c.

Furthermore, the conductive layer 20 needed to cover the surface of the block layer 24a is formed; the conductive layer 20 acts as the control gate CG of the memory cell MC and is connected with the word line WL.

In addition, the selection transistor ST1 is formed near the cross point of the selection signal line SGD and the semiconductor layer SC, and the selection transistor ST2 is formed near the cross point of the selection signal line SGS and the semiconductor layer SC.

Furthermore, in the plane P0, due to the fact that the memory string MS is formed into a U shape, the word lines WL7, WL6, WL5 and WL4 are formed in order on the lower side of the selection signal line SGD_5, which is arranged on the word line WL of the uppermost layer, and the WL3, WL2, WL1, and WL0 and the selection signal line SGS_5 are formed in order from the lower layer to the upper layer and connected to each other by the joint part JP11 (back gate device MCBG); namely, the selection transistor ST1, the memory cell MC, the back gate device MCBG, the memory cell MC and the selection transistor ST2 are configured into a U shape.

In addition, the memory strings MS are arranged by using the layer group direction as the longer direction; meanwhile, the same arrangement method is used by the semiconductor layers SC13 and SC14.

Furthermore, one end of the semiconductor layer SC12 penetrating the selection signal line SGS_5 is connected on the source line SL, and one end of the semiconductor layer SC13 is connected on the source line SL; in other words, the source line SL is used as the common object in order to join the abutted semiconductor layers SC11 and SC12 with the semiconductor layers SC13 and SC14.

Additionally, one end of each semiconductor layer SC11 and the semiconductor layer SC14 penetrating the selection signal line SGD_5 and SGD_4 is commonly connected with the bit line BL_0; one end of each semiconductor layer SC21 and the semiconductor layer SC24 penetrating the selection signal line SGD_5 and SGD_4 is commonly connected with the bit line BL_1. Meanwhile, one end of the semiconductor layer SC31 and the semiconductor layer SC34 are also commonly connected with the bit line BL_2; additionally, one end of the semiconductor layer SCm1 and the semiconductor layer SCm4 are commonly connected with the bit line BL_m.

In addition, further description has been omitted due to the fact that the structure of the memory string MS formed at the semiconductors SC13 and SC14 is the same as the structure of the memory strings MS formed on the semiconductor SC11 and the semiconductor layer SC12.

According to the figures, the word line WL0 and the word line WL7 are formed separate from each other between the abutted semiconductor layers SC such as SC11 and SC12; and the other word lines WL including the word line WL1 and the word line WL6 are of the same structure.

In addition, each word line WL (WL0 to WL3), which is communicated by the abutted semiconductor layers SC12 and SC13, is separate from each other as in the figure, and further can be connected with each other.

Herein, the situation of memory cells MC0 to MC7 formed at each memory string MS is used as the example, but the number of the memory cells MC forming the memory stings MS are unlimited. Namely, the number of the memory cells MC should be 16 or 32; the number of the memory cells MC is set into S (S is natural number) in the following, if necessary.

In addition, the memory string MS sometimes includes a virtual cell having structure that is similar to the structure of the memory cell MC; in the example of FIG. 2, the virtual cell is sometimes arranged between the selection transistor ST1 and the memory cell MC7, is sometimes between the selection transistor ST2 and the memory cell MC0, or is sometimes between the back gate member MCBG and the memory cells MC4 and MC3, respectively. According to this description, the memory cells MC used for performing the electric memory are arranged into a three-dimensional structure on the plane P0; namely, the memory cells MC are arranged in a matrix shape in the layer group direction and are arranged in a matrix shape in the horizontal direction vertical to the layer group direction. According to this description, multiple memory units MC arranged in the layer group direction are connected in series so as to form the memory string MS.

<Row Decoder 12>

In FIG. 1, the row decoder 12 (also referred to as the grouping decoder) is described; the row decoder 12 decodes the grouping address signal input from the address command register 17 and selects a word line WL according to the decoding result, and the voltage generated by the internal voltage generating circuit 18 is applied to the selected word line WL by the CG line driver 19.

<Data Circuit and Page Buffer 13>

The data circuit and the page buffer 13 have the sense amplifier 13-1 and the data cache 13-2 represented by the amplified graph; additionally, the sense amplifier 13-1 includes a latch circuit LT.

When the read operation is input at the control circuit 15, the sense amplifier 13-1 will select the data of the memory cell MC to read according to the control carried out by the control circuit 15.

After the latch circuit LT temporarily maintains the read data, the latch circuit LT will transmit the data to the data cache 13-2 according to the stipulated time and then input the control signal (RE signal) needed by the input/output data from the host (controller).

Then, the address command register 17 will supply a column address to the row decoder 14 according to the clock pulse of RE. The row decoder 14 corresponding to the address command register 17 is changed to the selection state, but the data of the specified address is output towards the input-output circuit 16. The data output to the input-output circuit 16 is output to the external host according to the RE signal.

In addition, in a program operation, the command or address is input by a program data from the host (controller), and then the program data is received by the input-output circuit 16. The program data is stored in the data cache 13-2.

When the program operation is input at the control circuit 15 by the address command register 17, the control circuit 15 will transmit the program data kept in the data cache 13-2 to the latch circuit LT according to the specified time and then program the program data stored at the latch circuit LT onto the selection memory cell MC.

<Row Decoder 14>

The row decoder 14 is used for decoding the column address signal input from the address command register 17 and for selecting the column direction of the memory cell array 11.

<Control Circuit 15>

The entire action of the nonvolatile semiconductor memory device is controlled by the control circuit 15. That is to say, based on the control signal, the command and address provided by the address command register 17, the operation order of program operation, the read operation and the data erase operation are implemented.

In order to implement the order control, the control circuit 15 shall be used for controlling the actions of the various circuit regions including the nonvolatile semiconductor memory device; for example, the action of the internal voltage generating circuit 18 of generating the specified voltage shall be controlled. In addition, the CG line driver 19 for outputting the specified voltage to the word line WL and the bit line BL in the specified time shall be controlled. Furthermore, the output/input state of the input-output circuit 16 shall be controlled.

In addition, the control circuit 15 is used for outputting the Ready/Busy B signal (R/BB signal and Int. R/BB signal for short hereafter) to the host according to the null data situation and the read operation situation of the data circuit and page buffer 13.

The state of the R/BB signal set to be the state of the "H" level is called ready state. If it becomes this state, the nonvolatile semiconductor memory device can receive the command, data, address and the like from the host.

The state of the R/BB signal set to be the state of the "L" level is called busy state; in this state, the nonvolatile semiconductor memory device cannot receive the command, data, address and the like from the host.

<Input/Output Circuit 16>

The input-output circuit 16 is used for receiving the commands, addresses and program data from the external host (not shown in the figure) and then supplying these commands and addresses to the address command register 17, providing the program data to the data circuit and page buffer 13.

Then, according to the control of the control circuit 15, the reading data provided by the data circuit and page buffer 13 are output to the host.

The input-output circuit 16 has the control signal terminal and data output/input terminal in order to exchange the control signal and data with the host. The control signal includes chip enablement (CE), address latch enablement (ALE), command latch enablement (CLE), write enablement (WE), read enablement (RE), write protection (WP), etc. The data output/input terminal has I/O (input/output)_0 to I/O_7, for example.

By the state combination of the control signal, the information given to the data input terminal will be identified as the command, address and data. Of course, the structure having the command terminal and address terminal can be adopted at the same time.

<Instruction Addresses Register 17>

The address command register 17 keeps temporarily the command and address provided by the input-output circuit 16, provides the command to the control circuit 15, and provides the address to the row decoder 12 and row decoder 14.

<Internal Voltage Generating Circuit 18>

According to the control of the control circuit 15, the internal voltage generating circuit 18 generates the specified voltage in the process of the program operation, the read operation and the erase operation; for example, in the process of program operation, the voltage VPGM and voltage VPASS are generated, the voltage VPGM is provided to a selected word line WL as a program voltage, and the voltage VPASS is provided to unselected word lines WL.

Here, the voltage VPGM is set to an optimized level so that the threshold voltage of the selected memory cell MC can be shifted from an erase state to a certain positive state. In addition, VPASS voltage is set to an optimized level so that not only unselected memory cells turn on to transfer a potential of bit line to channel of the selected memory cell for the program operation, but also channel potential of the selected memory cell is boosted via capacitance between control gate CG and channel of unselected memory cells for program inhibition.

In addition, in the read operation, the internal voltage generating circuit 18 generates the voltage VCGR and the voltage VREAD, provides the voltage VCGR to the selected word line WL, and provides the voltage VREAD to the unselected word line WL.

Here, the voltage VCGR means the voltage of reading the data from the memory cell MC, for example, any one of the follow-up voltages V_BR, V_AR and V_CR. In addition, the voltage VREAD refers to the transfer voltage, which can be applied to the non-selective word line WL in the selected memory string MS, the data not kept in the memory cell MC, and the reading of the memory cell MC in the enablement state.

Furthermore, in the erase operation, the internal voltage generating circuit 18 generates the voltage VERA and applies it to the bit line and source line.

If the voltage lower than the voltage VERA, about 8 V is applied to the gates of the selection transistors ST1 and ST2 of the selection block BLK as the erase object; according to the phenomenon called GIDL (Gate Induced Drain Leakage), the electron hole pair will be generated at the semiconductor layer SC part near the gate on the side of the bit line BL of the selection transistor ST1 and the semiconductor layer SC part near the gate on the side of the unit source line SL of the selection transistor ST2. According to the electron hole pair, the semiconductor layer SC in the memory string MS is charged by the voltage VERA. 0 V is provided to the control gate CG of the memory cell MC. The holes are injected into the charge storage layer at this moment, so as to reduce the threshold voltage of the memory cell.

<CG Line Driver 19>

The CG line driver 19 is used for controlling CG lines and word lines in a selected block, the data circuit and page buffer 13 according to the control signal provided by the control circuit 15. The control circuit 15 is used for controlling the row decoder 12, the data circuit and page buffer 13 according to the command signal provided by the address command register 17.

<Circuit Diagram of Memory Cell Array 11>

Figure 3:
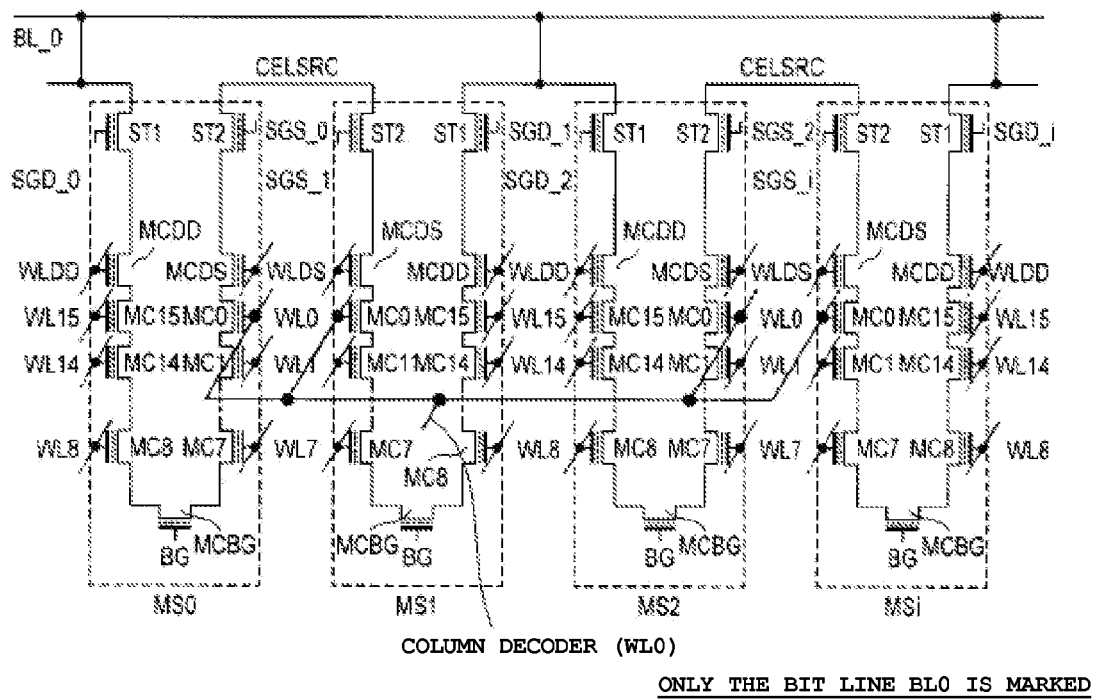
FIG. 3 is an equivalent circuit diagram of the memory cell array of the first embodiment.

Next, the equivalent circuit of the plane P is described in the FIG. 3. Here, the memory strings MS0 to MSi (i of MS0 to MSi in the figure is an arithmetic number) connected to the bit line BL0 are mainly described. Besides, since each component of the memory strings MS0 to MSi are the same, the memory string MS0 will be explained below. The number of the memory cells MC of the various memory strings MS is 16 (s=16).

<Memory String MS0>

As shown in FIG. 3, the memory string MS0 has the memory cells MC0 to MC15, the back gate transistor MCBG (MCBG for short hereafter), selection transistor ST1 and selection transistor ST2.

As previously mentioned, the control gates CG of the memory cells MC0 to MC15 are connected with the corresponding word lines WL, respectively. That is to say 16 word lines WL in the memory string MS0 are connected.

The memory cells MC0 to MC7 are connected in series between the selection transistor ST2 and MCBG.

One end of the current path of the selection transistor ST2 is connected to the source line SL for providing the signal SGS_0 to the gate of the selection transistor ST2. One end of the current path of the memory cell MC7 is connected with one end of the current path of the MCBG for providing the signal BG to the gate BG of the MCBG.

In addition, the memory cells MC8 to MC15 are connected in series between the selection transistor ST1 and MCBG. One end of the current path of the selection transistor ST1 is connected to the bit line BL for providing the signal SGD_0 to the gate. One end of the current path of the memory cell MC8 is connected to the other end of the current path of the MCBG.

Next, the various control gates CG of the memory cells MC0 to MC15 located in the memory strings MS0 to MSi of the description are connected with each other jointly. That is to say, in case the operation with an eye to the control gate CG of the memory unit MC0, for example in the memory strings MS0 to MSi, the control grinds CG are jointly connected to the word line WL0.

In addition, the control gates CG of the memory cells MC1 to MC15 are jointly connected to the respective word lines WL1 to WL15, respectively.

Furthermore, the word line WL0 is jointly connected with all of the memory cells MC0 in the memory strings MS0 to MSi connected to other bit lines BL_1 to BL_m not shown in the figure.

As a result, the range for the joint connection of the word line WL is determined by the type of the nonvolatile semiconductor memory device, for example, the size of the memory cell MC, the size of the wiring and transistor, etc. Assuming that the corresponding page length (the page is the access unit of the data) of the bit line BL in the arrangement direction is 8 k byte, the length of the memory string MS is the series connection of 16 memory cells; there are four strings in the common range among the memory strings MS along the direction of the bit line BL; the data storage capacitance of the various memory cells MC is 2 bits/unit; and the storage capacitance in the common memory string MS of the word line WL is 1 M Byte (8 k byte×16×4×2). Here, the range is called block BLK.

The read operation and the program operation are implemented for the nonvolatile semiconductor memory device according to the page length unit, but the erase operation is implemented according to the unit of block BLK; the size of block BLK is one example therein of free limitation of the size.

<Threshold Voltage Distribution of Memory Cell MC>

Next, the threshold voltage distribution of the memory cells MC and the maintaining data of the memory cells MC distributed according to the various threshold voltages are described with reference to FIG. 4. As shown in the FIG. 4, the vertical axis represents the number of the memory cells MC, and the horizontal axis represents the threshold voltage.

As shown in the figure, according to the charge injected into the charge storage layer, any voltage of, for example, four (4-levels) states (the threshold voltage Vth is divided into four data of the state E, state A, state B and state C according to the order from low to high) can be kept; in other words, assuming that the multi-level data of 2 bits/unit can be stored.

In addition, the implementation form is based on the multi-page storage of 2 pages kept at one memory cell MC. That is to say, based on the condition with an eye to the memory cell MC in the read operation and the program operation, in allusion to the data of 2 bits stored on the other memory cells, the read-program operation is not carried out; however, in the condition of carrying out storage as the lower page, the data of 1 bit of the lower page is read and written, but in the condition of carrying out storage as the upper page, the read-write data distribution mode shall be carried out for the data of 1 bit of the upper page.

First, the upper page is described. As shown in the FIG. 4, in the case of the state E and states A to C according to the upper page, the voltage of the memory cell MC shall be kept at "1," "0," "0" and "1" according to the order from low to high.

In addition, in the case of the state E and states A to C according to the lower page, the voltage of the memory cell MC shall be kept at "1," "1," "0" and "0" according to the order from low to high.

Here, the range of the threshold voltage of the state E in the memory cell MC is as follows: Vth<V_AR; additionally, the range of the threshold voltage of the state A is as follows: V_AR<Vth<V_BR. Moreover, the range of the threshold voltage of the state B is as follows: V_BR<Vth<V_CR. Furthermore, the range of the threshold voltage of the state C is as follows: V_CR<Vth<VREAD (not shown in the figure), but the memory cell MC can keep the data of 8 and above.

<About the CG Line Driver 19 and Other Peripheral Circuits>

Figure 5:
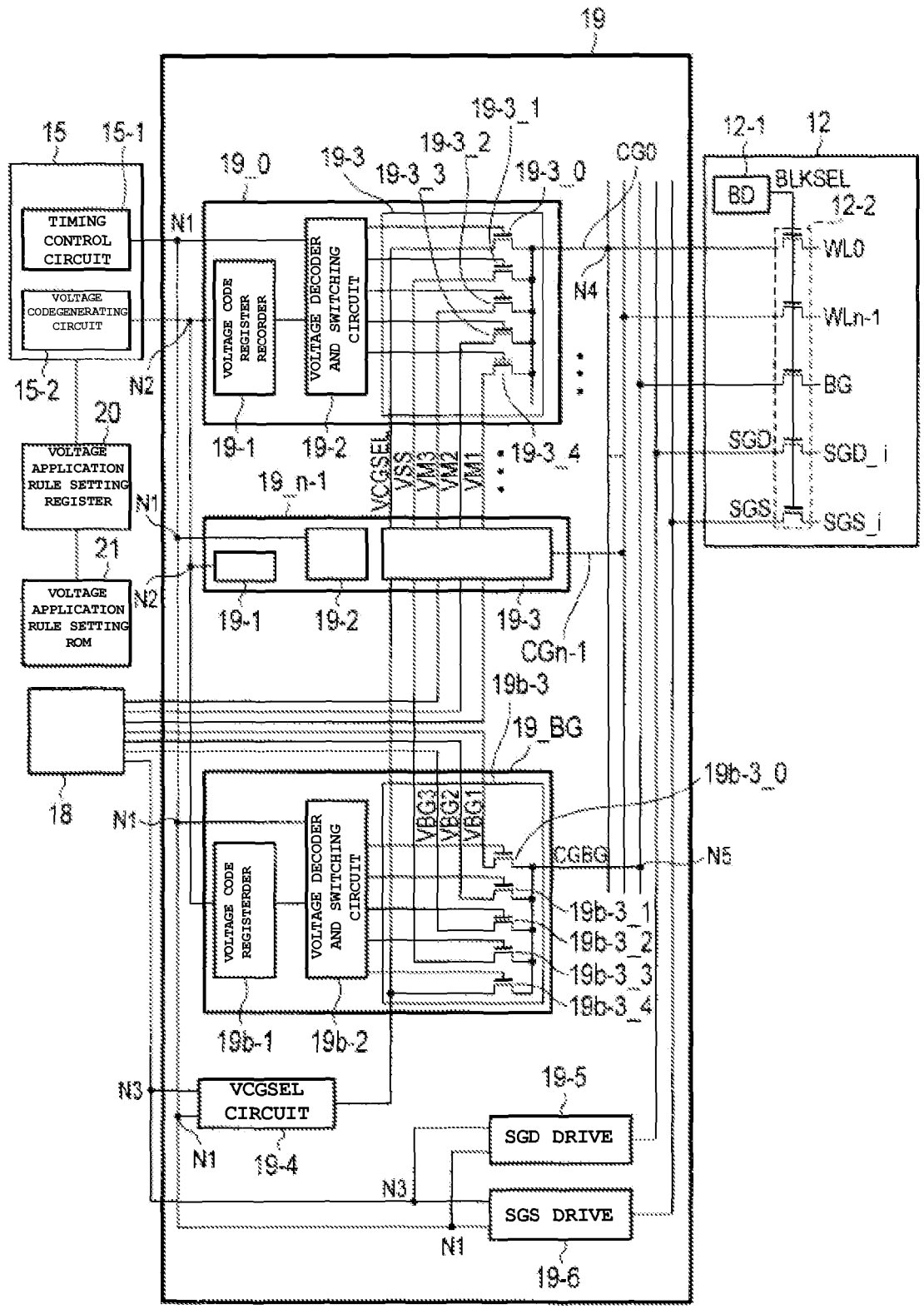
FIG. 5 is a conceptual diagram of a CG line driver and a peripheral circuit of the first embodiment.

The structure of the CG line driver 19 and other peripheral circuits are described in FIG. 5. In the FIG. 5, besides the CG line driver 19, the row decoder 12 (the block decoder 12-1 and the transfer circuit 12-2 are included in the figure), control circuit 15, internal voltage generating circuit 18, voltage application rule setting register 20, and voltage application rule setting ROM 21 are represented.

<Detailed Description of Control Circuit 15>

As shown in the figure, the control circuit 15 has the timing control circuit 15-1 and the voltage code generation circuit 15-2, wherein the timing control circuit 15-1 outputs the timing control signal to the voltage decoder and switching circuit 19-2 via the node N1, and the timing control signal is the signal of controlling the timing to apply set voltage decided by voltage code register 19-1.

In addition, the timing control circuit 15-1 outputs the timing control signal to the VCGSEL circuit 19-4, SGD driver 19-5 and SGS driver 19-6.

The information kept by the voltage code generation circuit 15-2 and voltage application rule register 20 is the basic generation voltage code, and the voltage code is output to the voltage code register 19-1.

<Voltage Application Rule Setting Register 20>

The voltage application rule register 20 of the voltage application rule setting is provided with the setting information of outputting voltage to the word line WL and the specified word line WL out of the selected word line WL by the voltage application rule setting ROM 21. Additionally, for the various actions including the read operation, the program operation and the like, the setting information shall be kept in the voltage application rule register 20.

<Voltage Application Rule Setting ROM 21>

The voltage application rule setting ROM 21 is used for keeping the setting information in the nonvolatile semiconductor memory device. Furthermore, when the nonvolatile semiconductor memory device is accessed with the power supply, after the reset of the action on the voltage application rule register 20, or in the condition of receiving the parameter reading command and the like kept by the voltage application rule setting ROM 21 from the host that is not shown in the figure, the setting information kept on the voltage application rule setting ROM 21 will be transmitted to the voltage application rule register 20.

<Detailed Description of CG Line Driver 19>

The CG line driver 19 has CG line driving circuits 19_0 to 19_$n$–1, BG line driving circuits 19_BG, VCGSEL circuit 19-4, SGD driver 19-5 and SGS driver 19-6.

<Detailed Description of CG Line Driving Circuits 19_0 to 19_$n$–1>

The output ends (the node N4 in the figure) of the CG line driving circuits 19_0 to 19_$n$–1 are respectively connected to the corresponding CG lines 0 to n–1.

The CG lines 0 to n–1 are connected to the word line WL in the memory cell array 11 via the transfer circuit 12-2 on the block decoder 12. The block decoder 12 in FIG. 5 is composed of the address block decoder part 12-1 corresponding to the block BLKi (called the storage block BLK hereafter) and transfer circuit 12-2 controlled by the same.

So, for example, in the condition of having 1 k storage block BLK at the memory cell array 11, the circuit of the block decoder 12 in FIG. 5 contains 1 k, but the CG lines 0 to n–1 can be directly connected to the block decoder 12 in FIG. 5. As shown in FIG. 1, in the condition of separating the memory cell array 11 by the plane P0 and plane P1, in order to make the block decoders 12 of the plane P0 and plane P1 carry out selective connection, the connection can be carried out by the transfer circuit.

These CG line driving circuits 19_0 to 19_$n$–1 have the voltage code registers 19-1, voltage decoder and switching circuit 19-2, and output driver 19-3, respectively. Due to having the same structure, only the CG line driving circuit 19_0 is described.

The voltage code registers 19-1 are used for receiving the voltage code from the voltage code generation circuit 15-2 and can keep the voltage code temporarily; then, the voltage code registers 19-1 can be used for outputting the voltage code to the voltage decoder and switching circuit 19-2.

The voltage decoder and switching circuit 19-2 is used for decoding the voltage code. According to the decoding, it can recognize which CG line driver outputs which voltage. In addition, the voltage decoder and switching circuit 19-2 are used for controlling the output driver 19-3 according to the timing control signal provided by the timing control circuit 15-1 in the level I of the decoding result.

The output driver 19-3 has five MOS transistors 19-3_0 to 19-3_4. If any of these transistors 19-3_0 to 19-3_4 is started in the enablement state according to the control of the voltage decoder and switching circuit 19-2, any of the voltages VCGSEL, VSS, or VM1 to VM3 will be output to the block decoder 12.

Here, as shown in FIG. 3, if the dummy unit is inserted into the memory string, the CG line driver for the dummy word line is needed; additionally, the CG driver and CG line driver 19-0 for the dummy word line use the identical structure.

<Detailed Description of BG Line Driving Circuit 19_BG>

As shown in the figure, the BG line driving circuit 19 BG has the voltage code registers 19$b$-1, voltage decoder and switching circuit 19$b$-2 and output driver 19$b$-3. The BG line driving circuit 19_BG and CG line driving circuit 19_0 have an identical basic structure, so the component part is simply described herein.

The BG line driving circuit 19_BG, based on the control of the voltage decoder and switching circuit 19-2, is used for outputting any one of the voltages VCGSEL, VSS, or VBG1 to VBG3 to the node N5 (CG_BG).

The structure of the output part 19$b$-3 is described as follows:

The output part 19$b$-3 has the MOS transistors 19$b$-3_0 to 19$b$-3_4, wherein one end of the current path of each MOS transistor is connected to the internal voltage generating circuit 18, and the other end (output end) of the current path is connected to the node CG_BG.

For example, the MOS transistor 19$b$-3_0 is used for transmitting the voltage VBG1 provided by the internal voltage generating circuit 18 to the node N5.

The MOS transistor 19$b$-3_1 is used for transmitting the voltage VBG2 (>the voltage VBG1) provided by the internal voltage generating circuit 18 to the node N5.

The MOS transistor 19$b$-3_2 is used for transmitting the voltage VBG3 provided by the internal voltage generating circuit 18 to the node N5.

Furthermore, the MOS transistors 19$b$-3_3 and 19$b$-3_4 are used for transmitting the output VCGSEL of the voltage VSS and VCGSEL circuits to the node N5, respectively.

In addition, the signal line CG_BG, which is the same as the CG line, is connected to the BG line in the cell array by the block decoder 12.

<Detailed Description of VCGSEL Circuit 19-4>

The voltage VCGSEL is the voltage applied to the word line WL. By supplying the voltage needed by the various actions from the internal voltage generating circuit 18, The VCGSEL circuit 19-4 outputs the applied read voltage (V_AR and V_BR) to the selected word line WL in the read operation and outputting the program voltage Vpgm to the selected word line WL in the program operation; then, the VCGSEL circuit 19-4 is used for providing these voltages to the CG line driving circuit 19-3 and BG line driving circuit 19$b$-3.

As shown in the figure, the VCGSEL circuit 19-4 is connected to the timing control circuit 15-1 by the node N1 and is connected to the internal voltage generating circuit 18 by the node N3. The timing control signal and specified voltage are provided to the VCGSEL circuit 19-4 by the timing control circuit 15-1 and the internal voltage generating circuit 18. The voltage VCGSEL is output by the VCGSEL circuit 19-4 according to the timing control signal.

<Detailed Description of SGD Drive 19-5>

As shown in the figure, the specified voltage from the internal voltage generating circuit 18 is provided to the SGD drive 19-5 by the node N3; additionally, the timing control signal is provided by the node N1. For example, in the read operation, the voltage of about 5 V is provided, and in the program operation, the voltage of about 2 V is provided.

The SGD drive 19-5, based on the timing control signal, outputs the voltage to the block decoder 12, and therefore, in the selected block, the applied voltage can be applied to the gate of the selection transistor ST1 forming the memory string MS to control the same.

<Detailed Description of the SGS Drive 19-6>

As shown in the figure, the specified voltage from the internal voltage generating circuit 18 is provided to the SGS drive 19-6 by the node N3; additionally, the timing control signal is provided by the node N1. For example, in the read operation, the voltage of about 5 V is provided, and in the program operation, the voltage making SGS in the off state is provided.

The SGS drive 19-6, based on the timing control signal, outputs the voltage to the block decoder 12; therefore, in the selected block, the applied voltage can be applied to the gate of the selection transistor ST2 forming the memory string MS to control the same.

<Method for Applying Voltage to Gate BG of MCBG and Word Line WL>

The method for applying voltage to gate BG of MCBG and word line WL will be described in FIG. 6A to FIG. 6C.

FIG. 6A represents the concept map of the various voltages applied to the selected word line WL, unselected word line WL, and gate BG of MCBG in the conversion process of the selected word line WL. FIG. 6B is the bar chart of the relevant voltages of the bold frame B extracted from FIG. 6A. Similarly, FIG. 6C is the bar chart of the relevant voltages of the bold frame (c) extracted from FIG. 6A.

First, FIG. 6A is described. The word line WL (only the digits 0 to 7 are recorded), the dummy word line (called DD) on the side of the bit line, the dummy word line (called DS) on the side of the unit source line, and BG are respectively taken from the row (transverse) and column (longitudinal). The row (transverse) represents the object as the selection state in the content, and the column (longitudinal) represents the voltage applied to the selection state, respectively.

Specifically, in the program operation, the voltage Vpgm is applied to the selected word line WL, and the voltage VM1 is applied to the other unselected word lines WL. Furthermore, the voltage VBG1 or VBG2 is applied to the gate BG according to the position of the selected word line WL. The description will focus on one example.

For example, as shown in the bold frame (b), in the process of writing the data in the memory cell MC1, the voltage Vpgm is applied to the selected word line WL1, the voltage VM1 is applied to the other unselected word lines WL0 and WL2 to WL7, and the voltage VBG1 is applied to the gate BG. The form is shown in FIG. 6B.

The MOS transistor 19-3_0 in the CG line driving circuit 19_1, MOS transistor 19-3_4 in the CG line driving circuits 19_0 and 19_2 to 19_7, and MOS transistor 19b-3_0 in the BG line drive 19_BG in FIG. 5 are respectively in the enablement state at this moment.

So, the voltage Vpgm is applied to the corresponding word line WL1 by the MOS transistor 19b-3_0, the voltage VM1 is applied to the corresponding unselected word line WL0 and WL2 to WL7 by the various MOS transistors 19-3_4, and then the voltage VBG1 is applied to the gate BG of the MCBG by the MOS transistor 19b-3_0.

In addition, as shown in the bold frame (c), in the process of writing the data in the memory cell MC3, the voltage Vpgm is applied to the selected word line WL3, the voltage VM1 is applied to the unselected word lines WL0 to WL2 and WL4 to WL7, and then the voltage VBG2 is applied to the gate BG. In other words, in case of the memory cell MC adjacent with the MCBG as the program object, the voltage VBG2, which is greater than the voltage VBG1, shall be applied to the gate BG. The form is shown in FIG. 6C.

The MOS transistors 19-3_4 in the CG line driving circuits 19_0 to 19_2 and 19_4 to 19_7, MOS transistor 19-3_0 in the CG line driving circuit 19_3, and MOS transistor 19b-3_1 in the BG line drive 19_BG in FIG. 5 are respectively in the enablement state at this moment.

Therefore, these MOS transistors 19-3_4 will apply the voltage VM1 generated by the internal voltage generating circuit 18 to the corresponding unselected word line WL0 to WL2 and WL3 to WL7, and then the MOS transistor 19b-3_2 will apply the voltage VBG2 generated by the internal voltage generating circuit 18 to the gate BG of the MCBG.

In addition, the relationship of the voltage VBG1, voltage VM1 and voltage Vpgm is as follows: voltage VM1≤voltage VBG1<voltage Vpgm.

In addition, the voltage applied to the gates of the selection transistors ST1 and ST2 is set to be the following structure; for example, the voltage is set to be the voltage of about 2 V and 0 V. Meanwhile, regardless of the position of the selected word line WL, the relevant voltage capable of realizing program and program-inhibit to the selected memory cell MC can be formed.

The second to fourteenth implementation forms also use the circuit diagram shown in FIG. 5, so the detailed description in FIG. 5 will be omitted for the following implementation form.

Effect According to First Embodiment

In the case of the nonvolatile semiconductor memory device according to the first embodiment, the program disturb can be restrained.

The effect is described by the example of the experimental data.

<Experimental Data>

Figure 7A:
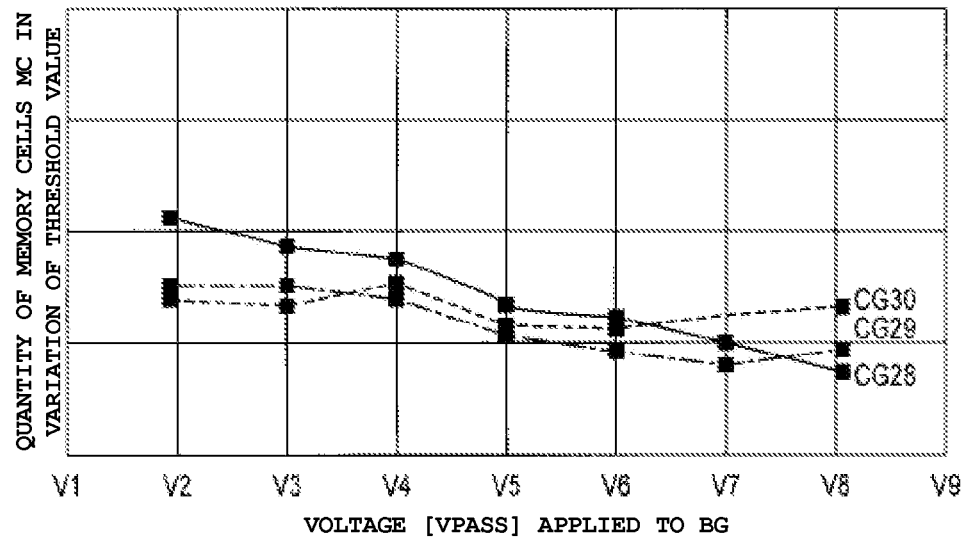
FIG. 7A is a conceptual graph showing the amount of memory cells with changed threshold voltages relative to the exerted voltage.

FIG. 7A represents the concept map of the quantities of the voltages Vpass applied to gate BG of the MCBG and memory cells MC generated by the variation of the threshold value. The horizontal axis is the voltage Vpass applied to the gate BG of the MCBG, and the vertical axis is the quantity of the memory cells MC in the variation process of the threshold value caused by the program disturb.

Figure 7B:
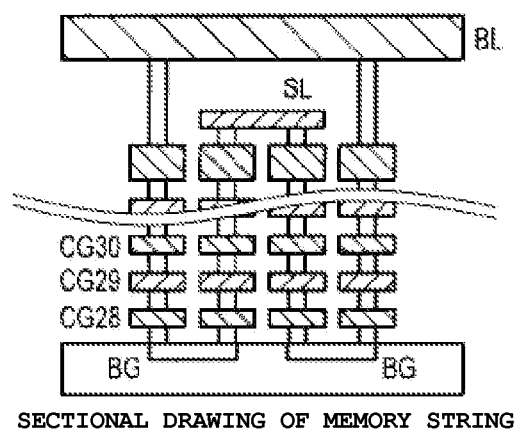
FIG. 7B is cross-sectional view of the memory string.

In addition, FIG. 7B represents the concept map (section direction) of the three-dimensional array of memory string MS; herein, the voltage Vpass includes the voltage VBG1 and voltage VBG2.

As shown in FIG. 7A for the test result, in the process of applying the programmed voltage Vpgm to the word line WL28, the larger the value of the voltage Vpass (e.g., the voltage V8 in the figure) applied to the gate BG of the adjacent MCBG is, the smaller the variation of the threshold value of the memory cell MC in the memory string MS is.

For the content, as shown in FIG. 7A and FIG. 7B, in the process of respectively applying the program voltage to the word lines WL29 and WL30 separated at the MCBG, in case of the voltage applied to the MCBG rising to the specified value (the voltage V6 in the figure), the number of the memory cells MC causing the variation of the threshold value will be improved (reduced); however, in case of the voltage Vpass being greater than the voltage (the voltage V6), the number of the memory cells MC causing the variation of the threshold value will be increased.

In other words, in the condition of applying the program voltage Vpgm to the memory cell MC close to the MCBG, the voltage greater than V6 will be applied to the gate BG of the MCBG; correspondingly, in the case of applying the program voltage Vpgm to the memory cell MC away from the MCBG, the voltage of about V6 will be applied to the gate BG of the MCBG.

According to the experimental data of the description, in the nonvolatile semiconductor memory device related to the implementation form, as shown in the FIG. 6A to FIG. 6C, the program voltage Vpgm is applied to the selected word line WL, and the voltage VM1 is applied to the unselected word line WL; either the voltage VBG1 or the voltage VBG2 is applied to the gate BG of the MCBG.

Specifically, in case of the nonvolatile semiconductor memory device according to the first embodiment, for example, when the program voltage Vpgm is applied to the word lines WL3 and WL4 adjacent with the MCBG (the memory cell MC3 and memory cell MC4 are regarded as the program objects), the voltage VBG2 is applied to the gate BG of the MCBG by the CG line driver 19.

In addition, when the program voltage is applied to the word lines WL, except for word lines WL3 and WL4, the voltage VBG1 is applied to the gate BG of the MCBG by the CG line driver 19.

By the application of the applying method, in the program operation, the number of the memory cells MC causing the variation of the threshold value can be reduced, and the program disturb can be reduced. The reason for the reduction of the interface is described.

In the memory cells MC forming the memory cell array MS, the word line WL is formed for surrounding the periphery of the semiconductor layer SC, so the potential on the surface of the semiconductor layer SC surrounded by the word line WL is featured with good control performance.

Figure 4:
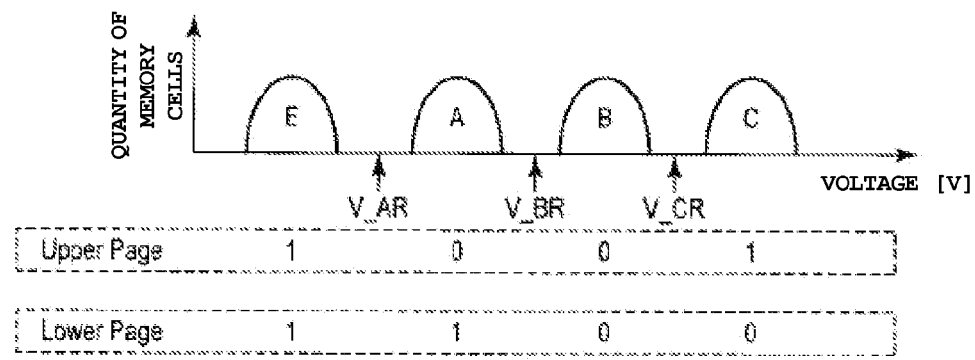
FIG. 4 is a chart showing the threshold distribution of the memory cells of the first embodiment.

For example, the following situation shall be considered herein; namely, before the voltage Vpgm is applied to the word line WL3, the threshold value distribution of the memory cell MC3 will be in the erase state (state E in FIG. 4).

In the process of applying program voltage, the voltage of about 2 V is applied to the gate of the selection transistor ST1 on the side of drain in the selected memory string MS, and the voltage of 0 V is applied to the gate of the selection transistor ST2 on the side of source, so that the selection transistor ST1 on the side of drain will transfer bit line voltage which is dependent on programmed data in to the memory string MS.

In addition, the voltage VM1 is applied to the unselected word line WL in the memory string MS, so that the channel will be formed at the semiconductor layer SC of these unselected memory cells MC.

Herein, in case of the program operation, in other words, programming, carried out on the selected memory cell MC in the selected memory string MS, the low potential (e.g., 0 V) will be applied to the bit line BL by the data circuit and page buffer 13, so that the potential applied to the bit line BL will be transmitted to the selected memory cell MC in the memory string MS.

Therefore, if the voltage Vpgm is applied to the word line WL as the selected memory cell MC, a certain amount of electron is injected to the charge trap layer of the selected memory cell so that the threshold voltage is shifted to a certain positive level.

On the other hand, in the program-inhibition condition, the high potential (e.g., 3 V) will be applied to the bit line BL. The selection transistor ST2 on the side of source is in turn-off state, so that the semiconductor layer SC in the selected memory string MS will be charged up by the bit line BL through the selection transistor ST1 on the side of drain until the selection transistor ST1 is in turn-on state.

When the voltage VM1 and voltage Vpgm are being applied to the unselected word line WL and selected word line WL, in the transition state, the potential of the channel of the semiconductor layer SC will be coupled up by a coupling between word lines WL and semiconductor layer SC.

Because the semiconductor layer SC in the memory string MS will be in the floating state after the selection transistor ST1 became turn-off state; therefore, the potential of the semiconductor layer SC will be raised along with the increase of the unselected word lines WL mainly.

At this moment, it can be thought that, according to the voltage Vpgm applied to the word line WL3, the potential of the channel of the selected memory cell MC3 will be higher than the potential of the unselected memory cell MC4 and the like applied with the voltage VM1 and etc.

At this moment, in case of a large potential difference between the potential of the channel under the memory cell MC3 and the potential of the channel formed near the adjacent MCBG, it is thought that the electron hole pair will be generated at the semiconductor layer SC.

As a result, if the electron is injected to near charge trapping layer, the threshold voltage of the surrounding memory cells MC will be changed to generate the so-called program disturbance.

However, in the case of the nonvolatile semiconductor memory device according to the first embodiment, with the memory cell MC3 or MC4 as the program object, the voltage VBG2 greater than the voltage VBG1 will be applied to the gate BG of these adjacent MCBG.

Therefore, the generation of the electron and hole pair, when the memory cells MC3 and MC4 are selected in program operation, can be restrained due to the reduced potential difference between the channel of BG and MC3 or MC4, and the program disturb also can be reduced.

Second Embodiment

The nonvolatile semiconductor memory device according to the second embodiment will be described. In the second embodiment, besides the voltage VBG1 and voltage VBG2, the voltage VBG3 (>VBG2) will be further generated, and these voltages will be applied to the gate BG of the MCBG. In addition, the structure that is the same as that of the implementation form of the first embodiment will not be described herein.

<Method for Applying Voltage to Gate BG of MCBG and Word Line WL>

The method for applying voltage to gate BG of MCBG and word line WL will be described in FIG. 8A to FIG. 8D; additionally, the contents that are the same as those in the first embodiment will not be again described herein.

FIG. 8A represents the concept map of the various voltages applied to the selected word line WL, unselected word line WL, and gate BG of MCBG in the conversion process of the selected word line WL. FIG. 8B is the bar chart of the relevant voltages of the bold frame (b) extracted from FIG. 8A. FIG. 8C and FIG. 8D are the same.

First, FIG. 8A is described. The word line WL (only the digits 0 to 7 are recorded), the dummy word line (called DD) on the side of the bit line, the dummy word line (called DS) on the side of the unit source line, and BG are respectively taken from the row (transverse) and column (longitudinal). The row (transverse) represents the object as the selection state in the content, and the column (longitudinal) represents the voltage applied to the selection state respectively.

Specifically, in the program operation, the voltage Vpgm is applied to the selected word line WL, and the voltage VM1 is applied to the other unselected word lines WL. Furthermore, the voltage VBG1 to VBG3 is applied to the gate BG of the MCBG. The description will focus on one example.

For example, as shown in the bold frame (b), in the process of writing the data in the memory cell MC1, the voltage Vpgm is applied to the selected word line WL1, the voltage VM1 is applied to the other unselected word lines WL0 and WL2 to WL7, and the voltage VBG1 is applied to the gate BG. The form is shown in FIG. 8B.

For example, as shown in the bold frame (c), in the process of writing the data in the memory cell MC2, the voltage Vpgm is applied to the selected word line WL2, the voltage VM1 is applied to the other unselected word lines WL0 and WL3 to WL7, and the voltage VBG2 to the MCBG. The form is shown in FIG. 8C.

In addition, as shown in the bold frame (d), in the selection process of the word line WL3 and the process of writing the data in the corresponding memory cell MC3, the voltage Vpgm is applied to the selected word line WL3, the voltage VM1 is applied to the unselected word lines WL0 to WL2 and WL4 to WL7, and the voltage VBG3 is applied to the MCBG. In other words, in case of only the memory cell MC adjacent with the MCBG as the programmed object, the voltage VBG3 greater than the voltage VBG2 will be applied to the gate BG. The form is shown in FIG. 8D.

Effect According to Second Embodiment

In the case of the nonvolatile semiconductor memory device according to the second embodiment, the number of the memory cells MC in the variation of the threshold value can be reduced more effectively than in the first embodiment, and the program disturb can be reduced.

This is due to the fact that, in case of the nonvolatile semiconductor memory device according to the second embodiment, besides the voltage VBG1 and voltage VBG2, the voltage VBG3 is also applied to the gate BG of the MCBG. In addition, according to the experimental data, the optimum voltage is changed when the selected WL is 2 and 3 word lines WL away from the MCBG.

The test result shows the following: specifically, the voltage greater than the voltage VBG1 is the optimum voltage when the selected word line WL is two word lines WL away from the MCBG, and the voltage VBG1 is the optimum voltage (for example, voltage VBG2) when the selected word line WL three word lines WL away from the MCBG.

Furthermore, in the case of the nonvolatile semiconductor memory device related to the implementation form, the word line WL that is the program object from the MCBG can be monitored, so that the fine change can be carried out for the voltage applied to the gate BG of the MCBG.

This is due to that the following: specifically, as shown in FIG. 5, the output part 19b-3 has the MOS transistors 19b-3_0 to 19b-3_3 capable of outputting the voltage VBG1 to voltage VBG3. According to the selected word line WL, both the voltage decoder and switching circuit 19b-2 can be used for converting the ON/OFF function of the MOS transistors 19b-3_0 to 19b-3_3.

Similarly, in the case of the nonvolatile semiconductor memory device related to the implementation form, the number of the memory cells MC causing the variation of the threshold value can be reduced, and the program disturb also can be reduced.

Third Embodiment

The nonvolatile semiconductor memory device according to the third embodiment will be described in the following. The third embodiment is characterized in that, besides the voltage VM1, the voltage VM2 also can be applied to the unselected word line WL in the first embodiment.

Herein, the voltage VM1 is applied to the control gate CG of the unselected memory cell MC adjacent to the memory cell MC as the program object, and the voltage V2 is applied to the control gate CG of the unselected memory cell except for the control gate CG; the structure that is the same as that of the first embodiment will not be described again herein.

<Method for Applying Voltage to Gate BG of MCBG and Word Line WL>

The method for applying voltage to gate BG of MCBG and word line WL will be described in FIG. 9A to FIG. 9C.

FIG. 9A represents the concept map of the various voltages applied to word lines WL and gate BG of MCBG depending on where the selected WL is. Each column in the table shows the applied voltages when a certain WL is selected. FIG. 9B and FIG. 9C are the bar charts of the relevant voltages of the bold frame (b) extracted from FIG. 9A.

First, FIG. 9A is described. The word line WL (only the digits 0 to 7 are recorded), the dummy word line (called DD) on the side of the bit line, the dummy word line (called DS) on the side of the unit source line, MCBG, and selection transistors ST1 and ST2 are respectively taken from the row (transverse) and column (longitudinal). The row (transverse) represents the object as the selection state in the content, and the column (longitudinal) represents the voltage applied to the selection state.

For example, as shown in the bold frame (b), in the process of programming the data in the memory cell MC1, the voltage Vpgm is applied to the selected word line WL1, the voltage VM1 is applied to the unselected word lines WL0 and WL2 adjacent with the selected word line WL, and the voltage VM2 is applied to the other unselected word lines WL3 to WL7; furthermore, the voltage VBG1 is applied to the MCBG. The form is shown in FIG. 9B.

In addition, as shown in the bold frame (c), in the process of writing the data in the memory cell MC3, the voltage Vpgm is applied to the selected word line WL3, and the voltage VM1 is applied to the unselected word lines WL2 and WL4 adjacent to the word line WL3; additionally, the voltage VM2 is applied to the other unselected word lines WL0 and WL1 and the unselected word lines WL5 to WL7, and the voltage VBG2 is applied to the gate BG of the MCBG.

In other words, in case of the memory cell MC adjacent to the MCBG as the programmed object, the voltage VBG2 greater than the voltage VBG1 will be applied to the gate BG of the MBCG. The form is shown in FIG. 9C.

Effect According to Third Embodiment

In the case of the nonvolatile semiconductor memory device according to the third embodiment, besides the effect, the program disturb can be further reduced.

In the case of the nonvolatile semiconductor memory device according to the third embodiment, the voltage VM1 is applied to the unselected word line WL adjacent to the selected word line WL, and the voltage VM2 is applied to the unselected word lines WL. This is due to that the following: specifically, as shown in FIG. 5, the output part 19-3 has the MOS transistors 19-3_3 and 19-3_4 capable of outputting the voltage VM1 and voltage VM2, but the voltage decoder and switching circuit 19b-2 can be used for converting the ON/OFF function of the MOS transistors 19-3_3 and 19-3_4.

Therefore, in the condition of not generating a large potential difference among the adjacent memory cells MC, the program disturbance can be reduced; this is the same with the program disturbance among the memory cells MC and the adjacent MCBG, so the duplicative description has been omitted.

Fourth Embodiment

The nonvolatile semiconductor memory device according to the fourth embodiment will be described in the following. The fourth embodiment is different from the third embodiment as follows: in the condition of applying the program voltage Vpgm to the selected word lines WL3 and WL4, the voltage applied to the unselected word line WL is changed. In addition, the structure thereof is the same as that of the first embodiment, so the duplicative description has been omitted, and the differences from the third embodiment are only described herein.

<Method for Applying Voltage to Gate BG of MCBG and Word Line WL>

The method for applying voltage to gate BG of MCBG and word line WL will be described in FIG. 10A and FIG. 10B.

FIG. 10A represents the concept map of the various voltages applied to the unselected word line WL and gate BG of MCBG in the conversion process of the selected word line WL. FIG. 10B is the bar chart of the relevant voltages of the bold frame (b) extracted from FIG. 10A.

First, FIG. 10A is described. The word line WL (only the digits 0 to 7 are recorded), the dummy word line (called DD) on the side of the bit line, the dummy word line (called DS) on the side of the unit source line, and gate BG are respectively taken from the row (transverse) and column (longitudinal). The row (transverse) represents the object as the selection state in the content, and the column (longitudinal) represents the voltage applied to the selection state respectively. The description will focus on one example.

In the fourth embodiment, for example as shown in the bold frame (b), in the selection process of the word line WL3, the voltage VM1 is applied to the word line WL2 adjacent with the selected word line WL, and the voltage VM2 is applied to the unselected word lines WL0 and WL1 and the unselected word lines WL4 to WL7, except for the word line WL2. The form is shown in FIG. 10B.

In addition, they have the same situation in the process of applying the voltage Vpgm to the selected word line WL4.

Effect According to Fourth Embodiment

The nonvolatile semiconductor memory device according to the fourth embodiment can obtain the effect similar to that of the third embodiment. In other words, in the selection process of either of the word lines WL3 or WL4, the nonvolatile semiconductor memory device according to the fourth embodiment can apply the voltage VM1 to the adjacent word line WL2 or word line WL5 adjacent to either of the word line WL3 or word line WL4.

As a result, if the voltage VM1 is applied to at least one surface adjacent to the selected word line WL, the variation phenomenon of the threshold value caused by the memory cell MC forming the memory string MS will be reduced; therefore, the program disturbance will be reduced.

In other words, the nonvolatile semiconductor memory device according to the fourth embodiment can obtain the effect similar to that of the first embodiment.

Fifth Embodiment

The nonvolatile semiconductor memory device according to the fifth embodiment will be described in the following. The nonvolatile semiconductor memory device according to the fifth embodiment is different from the third embodiment in the use of the voltage VBG3. The structure thereof is the same as that of the first embodiment, so that the duplicative description has been omitted herein, and only the differences from the third embodiment will be described.

<Method for Applying Voltage to Gate BG of MCBG and Word Line WL>

The method for applying voltage to gate BG of MCBG and word line WL will be described with reference to FIG. 11A and FIG. 11B.

FIG. 11A represents the concept map of the various voltages applied to the selected word line WL, unselected word line WL, and gate BG of MCBG in the conversion process of the selected word line WL. FIG. 11B and FIG. 11C are the bar charts of the relevant voltages of the bold frames (b) and (c) extracted from FIG. 11A.

First, FIG. 11A is described. The word line WL (only the digits 0 to 7 are recorded), the dummy word line (called DD) on the side of the bit line, the dummy word line (called DS) on the side of the unit source line, and BG are respectively taken from the row (transverse) and column (longitudinal). The row (transverse) represents the object as the selection state in the content, and the column (longitudinal) represents the voltage applied to the selection state respectively.

In the fifth embodiment, for example, as shown in the bold frame (b), in the selection process of the word line WL1, the voltage VM1 is applied to the word lines WL0 and WL2 adjacent with the selected word line WL1, and the voltage VM2 is applied to the other unselected word lines WL3 and WL7, except for the word line. The form is shown in FIG. 11B.

In addition, as shown in the bold frame (c), in the selection process of the word line WL2, the voltage VM1 is applied to the word lines WL1 and WL3 adjacent with the word line WL2, and the voltage VM2 is applied to the other unselected word lines WL0 and WL4 to WL7. The form is shown in FIG. 11C.

Furthermore, as shown in the bold frame (d), in the selection process of the word line WL3, the voltage VM1 is applied to the word lines WL2 and WL4 adjacent with the word line WL3, and the voltage VM2 is applied to the other unselected word lines WL0, WL2, and WL5 to WL7. The form is shown in FIG. 11D.

Effect According to Fifth Embodiment

In the case of the nonvolatile semiconductor memory device according to the fifth embodiment, the effect obtained in the third embodiment can be further improved. Specifically, with the effect according to the third embodiment, the effect according to the first embodiment also can be improved.

The description has been provided in the first embodiment. According to the experimental data, the following result can be obtained. If the program voltage is applied to the word lines WL3 and WL4, the voltage applied to the gate BG of the MCBG is in inverse proportion to the variation of the threshold value of the memory cell MC. For the nonvolatile semiconductor memory device according to the fifth embodiment, as previously mentioned, in case of the selected word lines WL3 and WL4, the voltage VBG3 greater than the VBG2 is applied to the MCBG; therefore, the interference can be restrained efficiently.

Specifically, as shown in FIG. 5, the output part 19b-3 has the MOS transistors 19b-3_0 to 19b-3_3 capable of outputting the voltage VBG1 to voltage VBG3; according to the selected word line WL, the voltage decoder and switching circuit 19b-2 can be used for converting the ON/OFF function of these MOS transistors 19b-3_0 to 19b-3_3.

As a result, the program disturbance can be further restrained by applying the voltage VBG3 (>VBG2) to the gate BG of the MCBG as the fifth embodiment.

Sixth Embodiment

The nonvolatile semiconductor memory device according to the sixth embodiment will be described in the following. The nonvolatile semiconductor memory device according to the sixth embodiment is different from the third embodiment in the operation of applying the voltage VM1 to one surface of the adjacent memory cell MC (unselected word line WL) in the process of applying the voltage Vpgm to either of the memory cells MC3 and MC4 (word line WL3, or WL4) adjacent to the MCBG. In addition, the structure thereof is the same as that of the first embodiment, so that the duplicative description has been omitted herein, and only the differences from the third embodiment will be described.
<Method for Applying Voltage to Gate BG of MCBG and Word Line WL>

The method for applying voltage to gate BG of MCBG and word line WL will be described in reference to FIG. 12A to FIG. 12C.

The FIG. 12A represents the concept map of the various voltages applied to the selected word line WL, unselected word line WL, and gate BG of MCBG in the conversion process of the selected word line WL. In addition, the FIG. 12B and FIG. 12C are the bar charts of the relevant voltages of the bold frames (b) and (c) extracted from the FIG. 12A respectively.

First, FIG. 12A is described. The word line WL (only the digits 0 to 7 are recorded), the dummy word line (called DD) on the side of the bit line, the dummy word line (called DS) on the side of the unit source line, and gate BG are respectively taken from the row (transverse) and column (longitudinal). The row (transverse) represents the object as the selection state in the content, and the column (longitudinal) represents the voltage applied to the selection state.

In the sixth embodiment, as shown in the bold frame (b), in the selection process of the memory unit MC3 adjacent to the MCBG, the voltage VM1 shall be applied to the control gate CG (word line WL2) of the adjacent memory cell MC2, but the voltage VM2, not the voltage VM1, is applied to the word line WL4.

Similarly, as shown in the bold frame (c), in the selection process of the memory cell MC4 adjacent to MCBG, the voltage applied to the control gate CG of the adjacent memory cell MC3 is not VM1 but is VM2. The applying method of the voltage is the same as that of the fifth embodiment; therefore, the duplicative description has been omitted herein.

Effect According to Sixth Embodiment

The nonvolatile semiconductor memory device according to the sixth embodiment also can obtain the effect the similar to that of the third embodiment. In other words, the variation of the threshold value of the memory cell MC in the memory string MS can be reduced, and the program disturbance can be reduced at the same time.

In the case of the nonvolatile semiconductor memory device according to the sixth embodiment, as previously mentioned, in the selection process of either of the memory cells MC3 and MC4 (word line WL3 and word line WL4), the voltage VM1 shall be applied to the control gate CG (word line WL2 and word line WL5) of the memory cell MC2 or MC5 adjacent to either of the memory cells MC3 and MC4 (word line WL3 and word line WL4). In other words, the voltage VM1 shall be applied to the control gate CG of the unselected memory cell MC on at least one surface and adjacent to the selected memory cell MC.

As a result, even the memory cell MC on at least one surface adjacent to the selected memory cell MC will constitute the reduction variation of the threshold value of the memory cell MC in the memory string MS in the case of the applying of the voltage VM1, so that the program disturbance can be reduced.

As previously mentioned, the nonvolatile semiconductor memory device according to the sixth embodiment also can obtain the same effect as that of the third embodiment.

Seventh Embodiment

The seventh embodiment will be described in the following. The nonvolatile semiconductor memory device according to the seventh embodiment is different from the third embodiment in the operation of further applying the voltage VM3 less than the voltage VM2 to the unselected word line WL. In addition, the structure thereof is the same as that of the first embodiment, so that the duplicative description has been omitted herein, and only the differences from the third embodiment will be described.
<Method for Applying Voltage to Gate BG of MCBG and Word Line WL>

The method for applying voltage to gate BG of MCBG and word line WL will be described in reference to FIG. 13A to FIG. 13D.

Figure 13B:
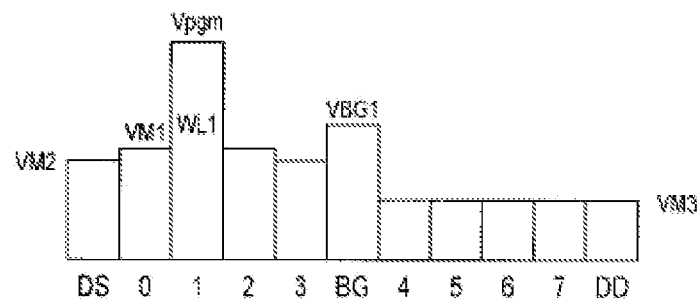
Figure 13C:
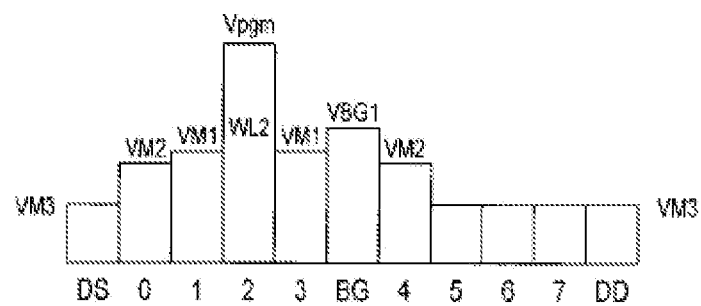
Figure 13D:
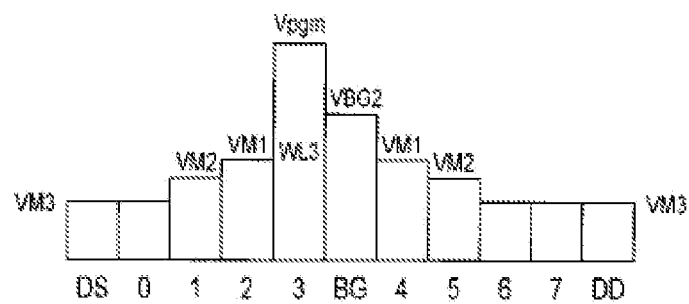

FIG. 13A represents the concept map of the various voltages applied to the selected word line WL, unselected word line WL, and gate BG of MCBG in the conversion process of the selected word line WL; the FIG. 13B and FIG. 13C are the bar charts of the relevant voltages of the bold frames (b) to (d) extracted from FIG. 13A.

First, FIG. 13A is described. The word line WL (only the digits 0 to 7 are recorded), the dummy word line (called DD) on the side of the bit line, the dummy word line (called DS) on the side of the unit source line, and gate BG are respectively taken from the row (transverse) and column (longitudinal). The row (transverse) represents the object as the selection state in the content, and the column (longitudinal) represents the voltage applied to the selection state.

As shown in the bold frame (b), in the selection process of the word line WL1, the voltage VM1 is applied to the word lines WL0 and WL2 adjacent with the selected word line WL1, the voltage VM2 is applied to the unselected word line WL3 adjacent with the word line WL2, and then the voltage VM3 (less than the voltage VM2) is applied to the other unselected word lines WL4 to WL7. The form is shown in FIG. 13B.

In addition, as shown in the bold frame (c), in the selection process of the word line WL2, the voltage applying method the same as the situation of the selected word line WL1 is also adopted. In other words, by regarding the selected word line WL2 as the center, the voltage VM1 is applied to the unselected word lines WL1 and WL3, the voltage VM2 is applied to the word lines WL0 and WL4 adjacent with the word lines WL1 and WL3, and the voltage VM3 is applied to the other unselected word lines WL5 to WL7.

Effect According to Seventh Embodiment

In the case of the nonvolatile semiconductor memory device according to the seventh embodiment, the effects of the first to sixth implementation forms can be obtained, and the potential difference of the channel among the adjacent memory cell MC also can be alleviated.

In the case of the nonvolatile semiconductor memory device according to the seventh embodiment, besides the voltage VM1 and voltage VM2, the structure of generating the voltage VM3 is also provided. Specifically, as shown in FIG. 5, this is due to the fact that the output part 19-3 has the MOS transistors 19-3_2 to 19-3_4 capable of transmitting the voltage VM1 to the voltage VM3 and the voltage decoder and switching circuit 19-2 capable of selectively converting the ON/OFF function of these MOS transistors 19-3_2 to 19-3_4.

In the application process of the output part 19-3 and voltage decoder and switching circuit 19-2, as shown in FIG. 13A to FIG. 13D, by regarding the selected word line as the center, the voltage applied to the unselected word line WL can be reduced according to the order VM1≥voltage VM2≥VM3 so that the potential difference of the channel of the adjacent memory cells MC can be alleviated.

Therefore, the generation of the electron hole pair caused by the large potential difference among the adjacent memory cells MC can be restrained, and the Program disturbance can be reduced.

Eight Embodiment

The nonvolatile semiconductor memory device according to the eighth embodiment will be described in the following. The nonvolatile semiconductor memory device according to the eighth embodiment is different from the fourth embodiment in the operation of periodically reducing the voltage applied to the unselected word line WL by the voltage VM3. In addition, the structure thereof is the same as that of the first embodiment, so that the duplicative description has been omitted herein, and only the differences from the fourth embodiment will be described.

<Method for Applying Voltage to Gate BG of MCBG and Word Line WL>

The method for applying voltage to gate BG of MCBG and word line WL will be described in reference to FIG. 14A to FIG. 14D.

FIG. 14A represents the concept map of the various voltages applied to the unselected word line WL and gate BG of MCBG in the conversion process of the selected word line WL. The word line WL (only the digits 0 to 7 are recorded), the dummy word line (called DD) on the side of the bit line, the dummy word line (called DS) on the side of the unit source line, and gate BG are respectively taken from the row (transverse) and column (longitudinal). The row (transverse) represents the object as the selection state in the content, and the column (longitudinal) represents the voltage applied to the selection state.

In addition, the FIGS. 14B to 14D are the bar charts of the relevant voltages of the bold frames (b)-(d) extracted from the FIG. 14A.

For example, as shown in FIG. 14A, in the selection process of the word line WL1, by regarding the word line WL1 as the center, the voltage VM1 is applied to the adjacent word lines WL0 and WL2 respectively, and the voltage VM2 is applied to the word line WL3.

In addition, the voltage VM3 (the bold frame (b) for reference) is applied to the other unselected word lines WL4 to WL7; the form is shown in FIG. 14B.

Furthermore, for example, in the selection process of the word line WL2, by regarding the word line WL2 as the center, the voltage VM1 is applied to the adjacent word lines WL1 and WL2, and then the voltage VM2 is applied to the word line WL4 adjacent to the word line WL3 by the word lines WL0 adjacent to the word line WL1 and the MCBG.

In addition, the voltage VM3 (the bold frame (c) for reference) is applied to the other unselected word lines WL5 to WL7; the form is shown in FIG. 14C.

Furthermore, for example, in the selection process of the word line WL3, by regarding the word line WL3 as the center, the voltage VM1 is applied to the adjacent word line WL2, the voltage VM2 is applied to the word line WL1 adjacent with the word line WL2 and the word line WL4, and then the voltage VM3 (the bold frame (d) for reference) is applied to other word lines WL5 to WL7; the form is shown in FIG. 14D.

Effect According to Eighth Embodiment

The nonvolatile semiconductor memory device according to the eighth embodiment can obtain the same effect as the first embodiment and can improve the effects related to the third and fourth implementation forms.

In other words, the Program disturbance can be restrained, and the program disturbance between the memory cells MC can be restrained as the first embodiment.

This is due to the fact that the CG line driver 19 shown in FIG. 5 is provided, as in the description of the seventh embodiment. Specifically, the output part 19-3 has the MOS transistors 19-3_2 to 19-3_4 capable of transmitting the voltage VM1 to the voltage VM3, and the voltage decoder and switching circuit 19-2 capable of selectively switching the ON/OFF function of these MOS transistors 19-3_2 to 19-3_4. Furthermore, as shown in FIG. 14A and FIG. 14D, by regarding the selected word line WL as the center, the voltage applied to the unselected word line WL is slowly reduced. As a result, the effect of this implementation form can be obtained by applying the proper voltage.

Ninth Embodiment

The nonvolatile semiconductor memory device according to the ninth embodiment will be described in reference to FIGS. 15A to 15D. The nonvolatile semiconductor memory device according to the ninth embodiment is different from the fifth embodiment in the operation of periodically reducing the voltage applied to the unselected word line WL by the voltage VM3. In addition, the structure thereof is the same as that of the first embodiment, so the duplicative description has been omitted herein, and only the differences from the fifth embodiment will be described.

<Method for Applying Voltage to Gate BG of MCBG and Word Line WL>

The method for applying voltage to gate BG of MCBG and word line WL will be described in reference FIG. 15A to FIG. 15D.

FIG. 15A represents the concept map of the various voltages applied to the selected word line WL, unselected word line WL, and gate BG of MCBG in the conversion process of the selected word line WL. The word line WL (only the digits 0 to 7 are recorded), the dummy word line (called DD) on the side of the bit line, the dummy word line (called DS) on the side of the unit source line, and gate BG are respectively taken from the row (transverse) and column (longitudinal). The row (transverse) represents the object as the selection state in the content, and the column (longitudinal) represents the voltage applied to the selection state.

In addition, the FIG. 15B to FIG. 15D are the bar charts of the relevant voltages of the bold frames (b) to (d) extracted from the FIG. 15A.

As shown in FIG. 15A, for example, in the selection process of the word line WL1, by regarding the word line WL1 as the center, the voltage VM1 is applied to the adjacent word lines WL0 and WL2 respectively, and the voltage VM2 is applied to the word line WL3.

In addition, the voltage VM3 (the bold frame (b) for reference) is applied to the other unselected word lines WL4 to WL7; the form is shown in FIG. 15B.

Similarly, in the selection process of the word line WL2, by regarding the word line WL2 as the center, the voltage VM1 is applied to the adjacent word lines WL1 and WL3 respectively, and then the voltage VM2 is applied to the word line WL4 adjacent to the word line WL3 by these word lines WL0 adjacent to the word line WL1 and the MCBG.

In addition, the voltage VM3 (the bold frame (c) for reference) is applied to the other unselected word lines WL5 to WL7; the form is shown in FIG. 15C.

In addition, the word line WL3 is also the same as the word lines WL1 and WL2 (the bold frame (d) for reference); the form is shown in FIG. 15D.

Effect According to Ninth Embodiment

In the case of the nonvolatile semiconductor memory device according to the ninth embodiment, the effect obtained in the fifth embodiment can be further improved. This is due to the fact that, in case of the nonvolatile semiconductor memory device according to the ninth embodiment, in the process of regarding the word lines WL3 and WL4 as the selected word lines WL, the voltage VBG3 greater than the voltage VBG2 is applied to the MCBG, and any of the voltage VM1 to the voltage VM3 can be applied to the specified unselected word line WL.

Therefore, in the case of the nonvolatile semiconductor memory device according to the ninth embodiment, by regarding the selected word line as the center, the voltage applied to the unselected word line WL can be slowly reduced according to the order of VM1=>voltage VM2=>VM3 to alleviate the potential difference of the channel among the adjacent memory cells MC, so as to alleviate the potential difference of the channel potentials of the adjacent memory cells MC.

Therefore, the generation of the electron hole pair caused by the large potential difference among the adjacent memory cells MC can be restrained, and the program disturbance can be reduced.

Tenth Embodiment

The nonvolatile semiconductor memory device according to the tenth embodiment will be described with reference to FIGS. 16A to 16C. The nonvolatile semiconductor memory device according to the tenth embodiment is different from the sixth embodiment in the operation of periodically reducing the voltage applied to the unselected word line WL by the voltage VM3 in addition to the voltage VM1, VM2 along with the leaving of the selected word line WL. In addition, the structure thereof is the same as that of the first embodiment, so the duplicative description has been omitted herein, and only the differences from the sixth embodiment will be described.

<Method for Applying Voltage to Gate BG of MCBG and Word Line WL>

The method for applying voltage to gate BG of MCBG and word line WL will be described in reference to FIG. 16A to FIG. 16C.

FIG. 16A represents the concept map of the various voltages applied to the selected word line WL, unselected word line WL, and gate BG of MCBG in the conversion process of the selected word line WL. The word line WL (only the digits 0 to 7 are recorded), the dummy word line (called DD) on the side of the bit line, the dummy word line (called DS) on the side of the unit source line, and gate BG are respectively taken from the row (transverse) and column (longitudinal). The row (transverse) represents the object as the selection state in the content, and the column (longitudinal) represents the voltage applied to the selection state.

In addition, the FIG. 16B and FIG. 16C are the bar charts of the relevant voltages of the bold frames (b) and (c) extracted from the FIG. 16A.

As shown in FIG. 16A, in the selection process of the memory cell MC3 adjacent to the MCBG, the voltage VM1 is applied to the control gate CG (word line WL2) of the memory cell MC2 adjacent with the memory cell MC3, and the voltage VM2 (the bold frame (b) for reference) is applied to the control gate CG (word line WL4) of the memory cell MC4 adjacent to the memory cell MC3 by the MCBG. The form is shown in FIG. 16B.

Similarly, in the selection process of the memory cell MC4, the voltage VM1 is applied to the control gate CG (word line WL4) of the memory cell MC4 and the control gate CG (word line WL5) of the memory cell MC5 adjacent to MC4, and the voltage VM2 is applied to the control gate CG (word line WL3) of the memory cell MC3 adjacent to the memory cell MC4 by the MCBG. The form is shown in FIG. 16C (the bold frame (c) for reference).

Effect According to Tenth Embodiment

In the case of the nonvolatile semiconductor memory device according to the tenth embodiment, the effect obtained in the sixth embodiment can be further improved. This is due to the fact that, in the case of the nonvolatile semiconductor memory device according to the tenth embodiment, in the process of regarding the word lines WL3 and WL4 as the selected word lines WL, the voltage VBG3 greater than the voltage VBG2 is applied to the MCBG, and any of the voltage VM1 to the voltage VM3 can be applied to the specified unselected word line WL.

Therefore, in case of the nonvolatile semiconductor memory device according to the tenth embodiment, by regarding the selected word line as the center, the voltage applied to the unselected word line WL can be slowly reduced according to the order of VM1 voltage VM2 VM3 to alleviate the potential difference of the channel among the adjacent memory cells MC, so as to alleviate the potential difference of the channel potentials of the adjacent memory cells MC.

Therefore, the generation of the electron hole pair caused by the large potential difference among the adjacent memory cells MC can be restrained, and the program disturbance can be reduced.

Eleventh Embodiment

The nonvolatile semiconductor memory device according to the eleventh embodiment will be described in reference to FIGS. 17A to 17D. The nonvolatile semiconductor memory device according to the eleventh embodiment is different from the ninth embodiment on the asymmetric data between the intensity of the voltage applied to the unselected word line WL on the side of source and the intensity of the voltage applied to the unselected word line WL on the side of drain by regarding the word line as the center. In addition, the structure thereof is the same with that of the first embodiment, so the duplicative description has been omitted herein, and only the differences from the ninth embodiment will be described.

<Method for Applying Voltage to Gate BG of MCBG and Word Line WL>

The method for applying voltage to gate BG of MCBG and word line WL will be described in reference to FIG. 17A to FIG. 17D.

FIG. 17A represents the concept map of the various voltages applied to the selected word line WL, unselected word line WL, and gate BG of MCBG in the conversion process of the selected word line WL. The word line WL (only the digits 0 to 7 are recorded), the dummy word line (called DD) on the side of the bit line, the dummy word line (called DS) on the side of the unit source line, and BG are respectively taken from the row (transverse) and column (longitudinal). The row (transverse) represents the object as the selection state in the content, and the column (longitudinal) represents the voltage applied to the selection state.

Figure 17B:
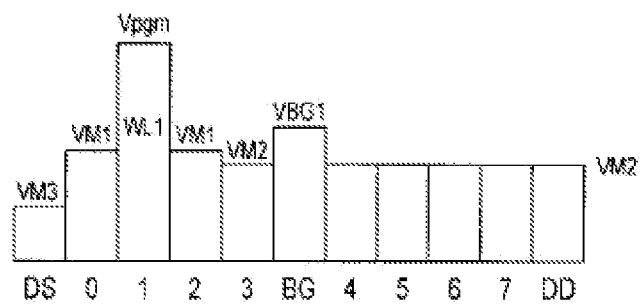
Figure 17C:
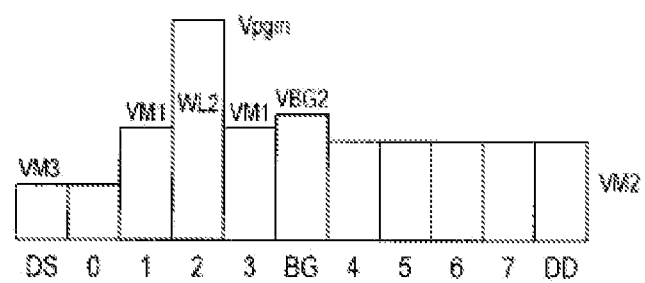
Figure 17D:
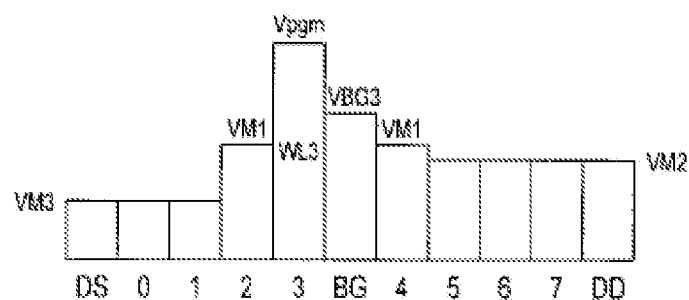

In addition, the FIG. 17B to FIG. 17D are the bar charts of the relevant voltages of the bold frames (b) to (d) extracted from the FIG. 17A.

As shown in FIG. 17A, in the selection process of the memory cell MC1 (word line WL1), the voltage VM1 is applied to the control gate CG (word line WL0) of the memory cell MC0 closer to the side of source than the memory cell MC1, the voltage VM1 and voltage VM2 are applied to the control gate CG (word lines WL2 and WL3) of the memory cells MC2 and MC3 closer to the side of drain than the memory cell MC1, respectively, and then the voltage VM2 is applied to the other unselected word lines WL4 to WL7 except the same.

In other words, like the previous implementation form, by regarding the selected word line as the center, the voltage applied to the unselected word line WL is not reduced periodically; watching from the selected word line WL, the asymmetric data between the intensity of the voltage applied to the word line WL on the side of source and the intensity of the voltage applied to the word line WL on the side of drain is formed (refer to thick frame (b)). The form is shown in FIG. 17B.

As previously mentioned, in the selection process of the memory cell MC2 (word line WL2), the voltage VM1 and the voltage VM2 are applied to the control gate CG (word line WL1 and word line WL0) of the memory cells MC1 and MC0 closer to the side of source than the memory cell MC2, respectively; the voltage VM1 is applied to the control gate CG (word line WL3) of the memory cell MC3 closer to the side of drain than the memory cell MC2; then, the voltage VM2 is applied to the word lines WL4 to WL7. As a result, watching from the memory cell MC2, the asymmetric data between the intensity of the voltage applied to the control gate CG (word line WL) of the memory cell MC on the side of source and the intensity of the voltage applied to the control gate CG (word line WL) of the memory cell MC on the side of drain is formed (refer to thick frame (c)). The form is shown in FIG. 17C.

In addition, the situation of the selected word line WL3 is the same as previously described, so the duplicative description has been omitted herein.

Next, the application of the method is due to the program order of the data for the memory cell MC. The description follows.

Specifically, it is due to the fact that the program order of the memory cell MC is considered in the applied voltage (the reason is as follows: as the center, the selected word line WL is in the state of the threshold value potential of the memory cell MC on the side of drain and source of the word line WL).

In the data program operation of the memory cell MC, the writing of the data from the memory cell MC starts on the side SL of source of the memory string MS generally.

Therefore, with a view to a certain selected word line WL, the data is written in the memory cell MC on the side of source, but most of the memory cells MC on the side of drain are kept in the erase state.

For example, in the process of writing the data "1" (program inhibition state) in the memory cell MC corresponding to the selected word line WL, in order to reduce the pressure of the selected memory cell MC as much as possible, the potential in the range of the channel in the memory string MS shall be improved.

As an example, in the condition of regarding the memory cell MC2 as the programmed object, the data "0" has been written in the memory cell MC1, but the threshold voltage is heightened. In addition, the memory cell MC3 is in the state of the follow-up program data, namely the erase state (the low state of the threshold voltage).

At this moment, the voltage (voltage Vpass) applied to the unselected memory cell MC1 is different from the voltage (voltage Vpass) applied to the unselected memory cell MC3.

Therefore, the specified high voltage shall be applied to the unselected word line WL adjacent to the selected word line WL; however, for the distant unselected word line WL, the voltage (such as the voltage VM3) on the side of the bit line BL shall be reduced, and the voltage (such as the voltage VM2) on the side of source SL shall be improved.

In addition, by regarding the selected word line WL as the center and facing to the SL on the side of source, the voltage Vpgm→voltage VM1→voltage VM3 is formed; then, by regarding the word line WL as the center and facing to the side of bit line BL, the voltage Vpgm→voltage VM1→voltage VM3 is formed, and two voltages can be applied on the unselected word line. Furthermore, the potential of the multistage unselected word line WL can be changed by more than two voltages. This is the same as the following twelfth implementation form.

Effect According to Eleventh Embodiment

The nonvolatile semiconductor memory device according to the eleventh embodiment can obtain the same effect as that of the ninth embodiment.

In other words, the nonvolatile semiconductor memory device according to the eleventh embodiment, in the program operation, can reduce the number of the memory cells MC causing the variation of the threshold value and can reduce the program disturbance.

In order words, by regarding the selected memory cell MC as the center, even on the side of source and drain, the voltages applied to the control gates CG of the unselected memory cells MC are different; however, similar to the ninth embodiment, when the memory cells MC3 and MC4 are regarded as the program object, the voltage VBG3 greater than the voltage VBG2 is applied to the gate BG of the MCBG, and any of the voltage VM1 to the voltage VM3 is applied to the control gate CG of the specified unselected memory cell MC, so that, similar to the nonvolatile semiconductor memory device according to the ninth embodiment, the interference can be restrained.

Twelfth Embodiment

The nonvolatile semiconductor memory device according to the twelfth embodiment will be described in the following. The nonvolatile semiconductor memory device according to the twelfth embodiment is different from the tenth embodiment in the asymmetric data between the intensity of the voltage applied to the control gate CG of the unselected memory cell MC on the side SL of source and the intensity of the voltage applied to the unselected memory cell MC on the side of drain. In addition, the structure thereof is the same as that of the first embodiment, so the duplicative description has been omitted herein, and only the differences from the tenth embodiment will be described.
<Method for Applying Voltage to Gate BG of MCBG and Word Line WL>

The method for applying voltage to gate BG of MCBG and word line WL will be described in reference to FIG. 18A to FIG. 18D.

FIG. 18A represents the concept map of the various voltages applied to the selected word line WL, unselected word line WL, and gate BG of MCBG in the conversion process of the selected word line WL. The word line WL (only the digits 0 to 7 are recorded), the dummy word line (called DD) on the side of the bit line, the dummy word line (called DS) on the side of the unit source line, and BG are respectively taken from the row (transverse) and column (longitudinal). The row (transverse) represents the object as the selection state in the content, and the column (longitudinal) represents the voltage applied to the selection state.

In addition, the FIG. 18B to FIG. 18D are the bar charts of the relevant voltages of the bold frames (b) to (d) extracted from the FIG. 18A.

As shown in FIG. 18A, in the selection process of the memory cell MC1 (word line WL1), the voltage VM1 is applied to the control gate CG of the memory cell MC0 closer to the side of source than the memory cell MC1, the voltage VM1 and voltage VM2 are applied to the control gate CG of the memory cells MC2 and MC3 closer to the side of drain than the memory cell MC1 respectively, and then the voltage VM2 is applied to the control gate of memory cells MC4 to MC7 except the same. The form is shown in the FIG. 18B.

In addition, in the selection process of the memory cells MC2 and MC3 (word line WL2 and word line WL3), the method for applying the voltage to the unselected word line WL is shown in the corresponding FIG. 18C and FIG. 18D.

Effect According to Twelfth Embodiment

The nonvolatile semiconductor memory device according to the twelfth embodiment can obtain the same effect as that of the tenth embodiment above.

In other words, in the program operation, the nonvolatile semiconductor memory device according to the twelfth embodiment also can reduce the number of the memory cells MC causing the variation of the threshold value, and it reduce the program disturbance.

By regarding the selected memory cell MC as the center, even on the side of source and drain, the voltages applied to the control gates CG of the unselected memory cells MC are different, but they are the same as that of the tenth implementation form; when the memory cells MC3 and MC4 are regarded as the programmed object, the voltage VBG3 greater than the voltage VBG2 is applied to the gate BG of the MCBG, and any of the voltage VM1 to the voltage VM3 is applied to the control gate CG of the specified unselected memory cell MC, so that similar to the nonvolatile semiconductor memory device according to the tenth embodiment, the interference can be restrained.

Thirteenth Embodiment

The nonvolatile semiconductor memory device according to the thirteenth embodiment will be described in reference to FIGS. 19A to 19D. The nonvolatile semiconductor memory device according to the thirteenth embodiment is characterized by keeping the channel of the program inhibition memory cell MC at the high potential to suppress the program disturbance, so that, in the eleventh embodiment, the voltage applied to the control gate CG of the unselected memory cell MC from the selected memory cell MC to the side of source is reduced periodically to reduce the potential difference among the adjacent memory cells MC. In addition, in the case of the dropping to the minimum voltage (e.g., the voltage VM5), the applied voltage is improved again by regarding the memory cell MC applied with the minimum voltage as the boundary.

The voltage applying method will be described in reference to FIGS. 19A to 19D.
<Method for Applying Voltage to Gate BG of MCBG and Word Line WL>

The method for applying voltage to gate BG of MCBG and word line WL will be described in reference to FIG. 19A to FIG. 19D.

FIG. 19A represents the concept map of the various voltages applied to the unselected word line WL and gate BG of MCBG in the conversion process of the selected word line WL. The word line WL (only the digits 0 to 7 are recorded), the dummy word line (called DD) on the side of the bit line, the dummy word line (called DS) on the side of the unit source line, and gate BG are respectively taken from the row (transverse) and column (longitudinal). The row (transverse) represents the object as the selection state in the content, and the column (longitudinal) represents the voltage applied to the selection state.

In addition, the FIG. 19B to FIG. 19D are the bar charts of the relevant voltages of the bold frames (b) to (d) extracted from the FIG. 19A.

As shown in FIG. 19A, in the selection process of the memory cell MC3, the voltage VM1, voltage VM3 and voltage VM4 are applied to the various control gates CG of the memory cells MC2, MC1 and MC0 closer to the side of source than the memory cell MC3 respectively; the voltage VM1 is applied to the control gate CG of the memory cell MC4 closer to the side of drain than the memory cell MC3; then, the voltage VM1 and voltage VM2 are applied to the control gates CG of the memory cells MC6 to MC11 by the control gate CG of the memory cell MC5, and the MCGB respectively; additionally, the voltage VM5 is applied to the gate of the selection transistor ST2. The form is shown in FIG. 19B.

As previously mentioned, in the selection process of the memory cell MC4, the voltage VM1 to the voltage VM5 are applied to the control gates CG of the memory cells MC3 to MC0 closer to the side of source than the memory cell MC4 respectively; the voltage VM1 is applied to the control gate CG of the memory cell MC5 closer to the side of drain than the memory cell MC4; then, the voltage VM2 is applied to the control gates CG of the memory cells MC6 to MC11 by the MCBG; additionally, the voltage VM4 is applied to the gate of the selection transistor ST2. The form is shown in FIG. 19C.

Then, in the selection process of the memory cell MC5, the voltage VM1 to the voltage VM5 are applied to the control gates CG of the memory cells MC4 to MC1 closer to the side of source than the memory cell MC5, and the voltage VM4 is applied to the control gate CG of the memory cell MC0 closer to the side of source than the memory cell MC1 by regarding the memory cell MC1 as the boundary. In addition, the intensity of the voltage applied to the control gate CG of the memory cell MC closer to the side of drain than the memory cell MC5 is the same as that of the eleventh embodiment, and the duplicative description has been omitted herein. The form is shown in FIG. 19C.

As a result, as shown in FIG. 19C, by regarding the memory cell MC1 as the boundary, through the inversion of the applied voltage value, the range on the side of source of the memory cell MC1 can be separated from the range of the drain of the memory cell MC1 and the range of the memory cell MC11.

Effect According to Thirteenth Embodiment

In case of the effect according to the thirteenth embodiment, the effects of the first to twelfth implementation forms can be obtained; in the case of the program data, the potential of the channel on the side of the bit line BL shall be kept on the high potential.

In order words, in the case of the nonvolatile semiconductor memory device according to the thirteenth embodiment, the value of the voltage applied to the unselected word line WL shall be reduced periodically; for example, the range on the side of the source of the applied memory cell MC is separated by the voltage VM5, so that the drop of the potential of the channel in the range from the bit line BL in the process of programming the data to the side of drain of the memory cell MC (in the thirteenth embodiment, from the bit line BL to the word line WL5) shall be restrained.

Therefore, when any of the unselected voltages VM1 to VM5 is applied to the control gate CG of the unselected memory cell MC, the voltage can be restrained from been written onto these unselected memory cells MC.

Fourteenth Embodiment

The nonvolatile semiconductor memory device according to the fourteenth embodiment will be described in reference to FIGS. 20A to 20C. The fourteenth embodiment is different from the thirteenth embodiment in that, when the program voltage Vpgm is applied to either of the memory cells MC5 and MC6 adjacent with the MCBG, either voltage VM2 or VM3 different from the voltage VM1 is applied to one surface of the control gate CG of the adjacent unselected memory cell MC. In addition, the structure thereof is the same with that of the first embodiment, so the duplicative description has been omitted herein, and only the differences from the third embodiment will be described.

<Method for Applying Voltage to Gate BG of MCBG and Word Line WL>

The method for applying voltage to gate BG of MCBG and word line WL will be described in reference to FIG. 20A to FIG. 20C.

Figure 20B:
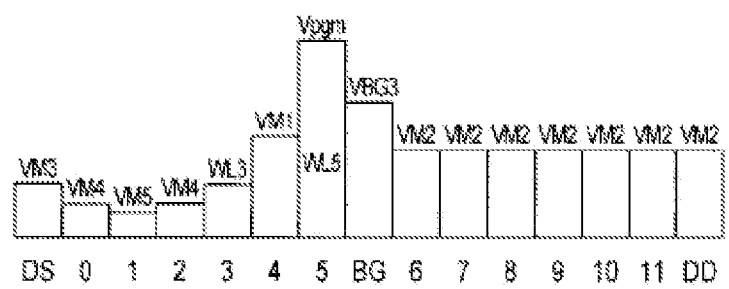
Figure 20C:
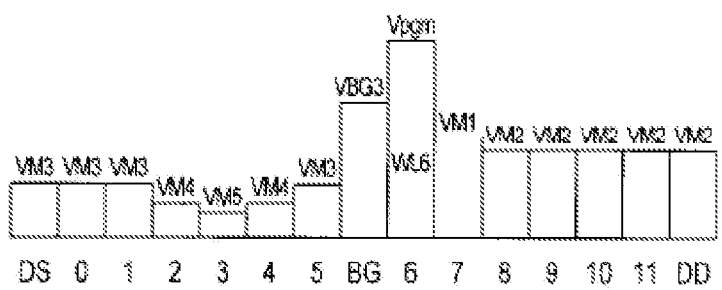

The FIG. 20A represents the concept map of the various voltages applied to the unselected word line WL and gate BG of MCBG in the conversion process of the selected word line WL. In addition, the FIG. 20B and FIG. 20C are the bar charts of the relevant voltages of the bold frames (b) and (c) extracted from the FIG. 20A respectively.

The FIG. 20A is described in the following. The word line WL (only the digits 0 to 7 are recorded), the dummy word line (called DD) on the side of the bit line, the dummy word line (called DS) on the side of the unit source line, and gate BG are respectively taken from the row (transverse) and column (longitudinal). The row (transverse) represents the object as the selection state in the content, and the column (longitudinal) represents the voltage applied to the selection state.

As shown in the bold frame (b), in the selection process of the memory cell MC5 (word line WL5), the voltage VM2 is applied to the control gate CG of the unselected memory cell MC6 adjacent with the memory cell MC5 by the MCBG. The form is shown in FIG. 20B.

In addition, as shown in the bold frame (c), in the selection process of the memory cell MC6 (word line WL6), the voltage applying method similar to the situation of regarding the memory cell MC5 as the programmed object is adopted. In other words, the voltage VM3 is applied to the control gate CG of the memory cell MC5 adjacent to the word line WL6 by the MCBG. The form is shown in FIG. 20C.

Effect According to Fourteenth Embodiment

In the case of the nonvolatile semiconductor memory device according to the fourteenth embodiment, the effect similar to the effects of the first to thirteenth implementation forms can be obtained.

In other words, the nonvolatile semiconductor memory device according to the fourteenth embodiment, in the mode of periodically reducing the value of the voltage applied to the control gate CG of the unselected memory cell MC, for example separating the range on the side of source of the applied memory cell MC by the voltage VM5, can restrain the drop of the potential of the channel in the range from the bit line BL in the program operation to the side of drain of the memory cell MC (e.g., in the thirteenth embodiment, from the bit line BL to the word line WL5).

First Deformation Example

The nonvolatile semiconductor memory device according to the first deformation example will be described in the following. In the first deformation example, the voltage applied to the gate BG of the MCBG shall be replaced by any of the voltage VM1 to voltage VM3. Next, the structure of the CG line driver 19 according to the first deformation example will be described. In addition, the structure the same as that of the CG line driver core drive 19 described in the first embodiment will not be again described.

<Structure of CG Line Driver 19>

Figure 21:
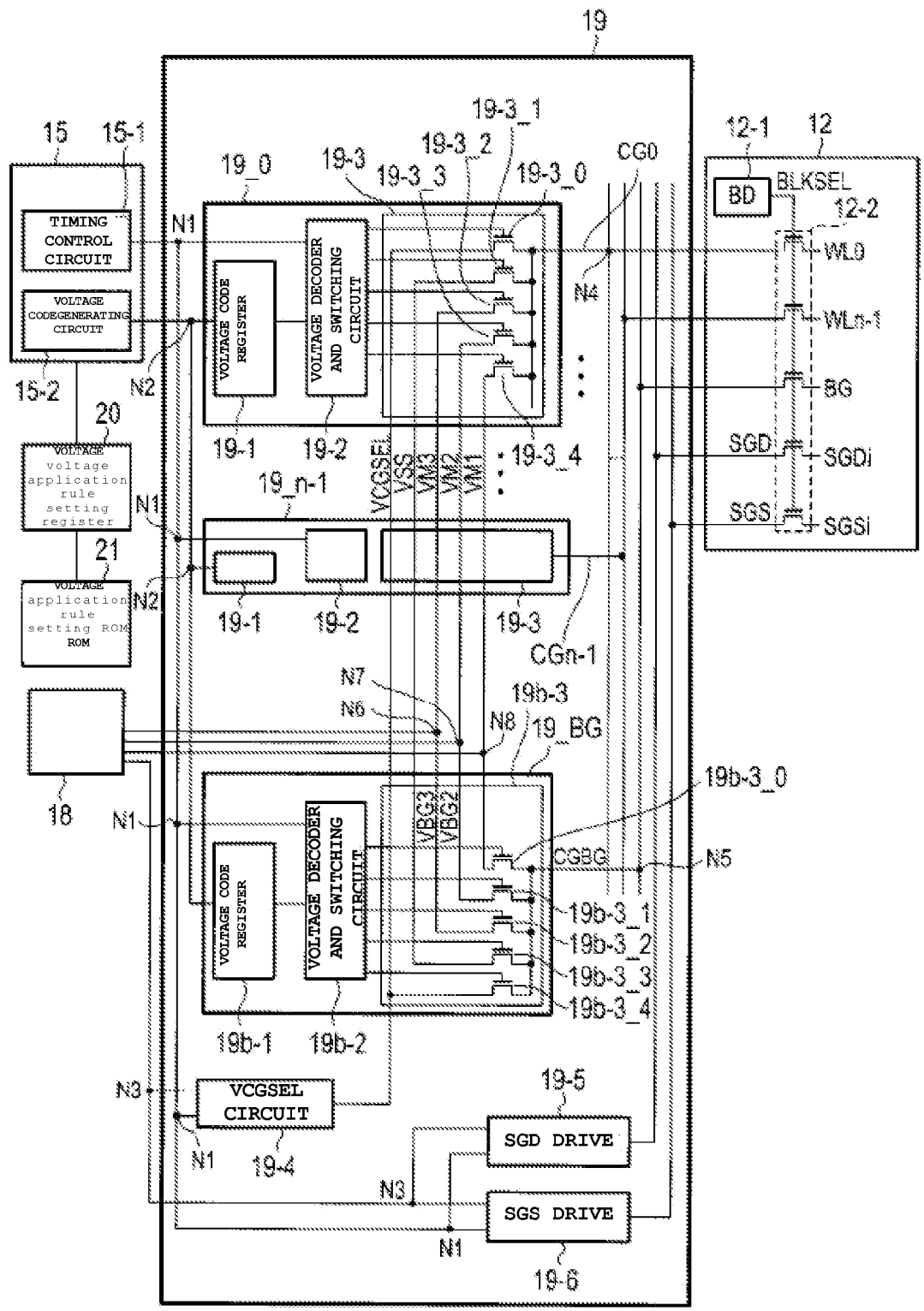
FIG. 21 is a conceptual diagram of a CG line driver and peripheral circuits relate to the CG line driver according to a first modified example.

The structure of the CG line driver 19 according to the first deformation example will be described in reference to FIG. 21. Herein, the output parts 19-3_0 to 19-3_(n−1) in the CG line driving circuits 19_0 to 19_(n−1), as well as the output part 19b-3 in the BG line driving circuit 19_BG, will be described. The following output parts 19-3_0 to 19-3_(n-1) are only called the output part 19-3.

According to the figures, one end of the current path of the MOS transistors 19-3_2 and 19b-3_2 in the output parts 19-3 and 19b-3 is jointly connected by the node N6. Furthermore, the voltage VM3 is provided to the node N6 by the internal voltage generating circuit 18. In other words, the MOS transistor 19b-3_2 has the function of applying the voltage VM3 to the gate BG of the MCBG.

One end of the current path of the MOS transistors 19-3_1 and 19b-3_1 in the output parts 19-3 and 19b-3 is jointly connected by the node N7. Furthermore, the voltage VM2 is provided to the node N7 by the internal voltage generating circuit 18. In other words, the MOS transistor 19b-3_1 has the function of applying the voltage VM2 to the gate BG of the MCBG.

Next, one end of the current path of the MOS transistors 19-3_0 and 19b-3_0 in the output parts 19-3 and 19b-3 is jointly connected by the node N8. Furthermore, the voltage VM1 is provided to the node N8 by the internal voltage generating circuit 18. In other words, the MOS transistor 19b-3_0 has the function of applying the voltage VM1 to the gate BG of the MCBG.

As previously mentioned, in the condition of replacing the voltage applied to the gate BG of the MCBG by any of the voltage VM1 to voltage VM3, the structure of the CG line driver 19 according to the first modification example can be adopted.

Furthermore, in case of the nonvolatile semiconductor memory device according to the first modification example, due to the common signal wire for providing the voltage, the wiring can be reduced, so as to reduce the area.

Second Modification Example

The nonvolatile semiconductor memory device according to the second modification example will be described in the following. In the second modification example, the voltage VBG1 applied to the gate BG of the MCBG is replaced by the voltage VM1. Next, the structure of the CG line driver 19 according to the second modification example will be described. In addition, the structure thereof is the same with the structure of the CG line driver 19 described in the first embodiment, so the duplicative description has been omitted herein.

<Components of CG Line Driver 19>

Figure 22:
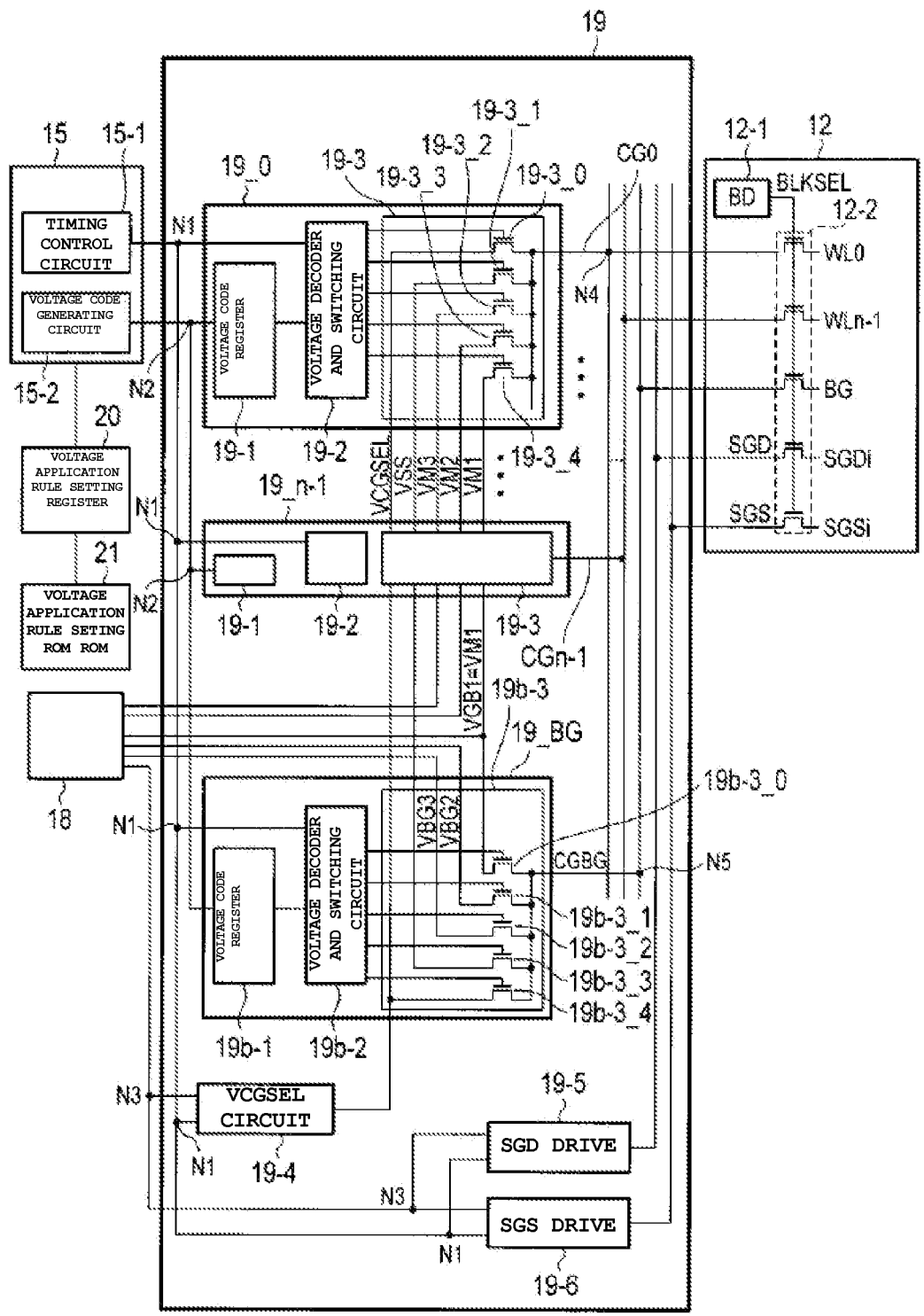
FIG. 22 is a conceptual diagram of a CG line driver and peripheral circuits according to a second deformation example.

The structure of the CG line driver 19 according to the first modification example will be described in reference to FIG. 22. Herein, the output parts 19-3_0 to 19-3_(n-1) in the CG line driving circuits 19_0 to 19_(n-1) and the output part 19b-3 in the BG line driving circuit 19_BG will be described. In addition, the following output parts 19-3_0 to 19-3_(n-1) are only called the output part 19-3.

According to the drawings, one end of the current path of the MOS transistors 19-3_0 and 19b-3_0 in the output parts 19-3 and 19b-3 is jointly connected by the node N9. Furthermore, the voltage VM1 is provided to the node N9 by the internal voltage generating circuit 18. In other words, the MOS transistor 19b-3_0 has the function of applying the voltage VM1 to the gate BG of the MCBG. The MOS transistors 19-3_0 and 19b-3_1 except the above are the same as those in the first embodiment, so the duplicative description has been omitted herein.

As previously mentioned, the structure of the CG line driver 19 according to the second deformation example can be used in the condition that the voltage applied to the gate BG of the MCBG can be replaced with the voltage VM1.

As previously mentioned, in case of the nonvolatile semiconductor memory device according to the second deformation example, due to the common signal wire for providing the voltage, the wiring can be reduced, so as to reduce the area.

While certain embodiments have been described, these embodiments have been presented by way of example only, and they are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Structure of the memory cell array 11 is not limited as above description. A memory cell array formation may be disclosed in U.S. patent application Ser. No. 12/532,030. U.S. patent application Ser. No. 12/532,030, the entire contents of which are incorporated by reference herein.

What is claimed is:

1. A nonvolatile semiconductor memory device, comprising:

multiple memory strings each including a plurality of first and second groups of serially connected memory cells, and a back gate transistor serially connected between the first and second groups of serially connected memory cells;

a plurality of word lines, each word line being connected to a control gate of a different memory cell in each of the memory strings;

a back gate line connected to the control gates of the back gate transistors; and a voltage generating circuit configured to generate first, second, and third control voltages of different voltage levels, the first voltage having a higher voltage level than the second control voltage and the second control voltage having a higher voltage level than the third control voltage; and a control circuit configured to control application of control voltages to the word lines and the back gate line, wherein when a word line connected to the control gates of the memory cells in the first and second groups that are adjacent to the back gate transistor is a selected word line, the first control voltage is applied to the selected word line and the second control voltage is applied to the back gate line, and when a word line connected to the control gates of the memory cells in the first and second groups that are that are not adjacent to the back gate transistor is a selected word line, the first control voltage is applied to the selected word line and a control voltage that is less than or equal to the third control voltage is applied to the back gate line.

2. The nonvolatile semiconductor memory device of claim 1, wherein the voltage generating circuit is configured to generate a fourth control voltage, the fourth control voltage having a lower voltage level than the third control voltage, and the fourth control voltage is applied to the word lines that are not selected.

3. The nonvolatile semiconductor memory device of claim 2, wherein when a word line connected to the control gates of the memory cells in the first and second groups that are not adjacent to the back gate transistor and are separated from the back gate transistor by just one memory cell, is a selected word line, the first control voltage is applied to the selected word line and the third control voltage is applied to the back gate line.

4. A nonvolatile semiconductor memory device, comprising:
multiple memory strings each including a plurality of first and second groups of serially connected memory cells, and a back gate transistor serially connected between the first and second groups of serially connected memory cells;
a plurality of word lines, each word line being connected to a control gate of a different memory cell in each of the memory strings;
a voltage generating circuit configured to generate control voltages of different voltage levels; and
a control circuit configured to control application of control voltages to the word lines and the back gate line, wherein a back gate line control voltage applied to the back gate line is varied depending on how far a selected word line is from the back gate line.

5. The nonvolatile semiconductor memory device of claim 4, wherein the back gate line control voltage is set to be at a first voltage level if the selected word line is adjacent to the back gate line and a second voltage level or lower if the selected word line is not adjacent to the back gate line, the second voltage level being lower than the first voltage level.

6. The nonvolatile semiconductor memory device of claim 5, wherein the back gate line control voltage is set to be at a third voltage level that is lower than the second voltage level if the selected word line is separated from the back gate line with more than one word line between the selected word line and the back gate line.

7. The nonvolatile semiconductor memory device of claim 6, wherein an unselected word line control voltage applied to unselected word lines is varied depending on how far the unselected word line is from the selected word line.

8. The nonvolatile semiconductor memory device of claim 7, wherein the unselected word line control voltage is set to be at a fourth voltage level if the unselected word line is adjacent to the selected word line and a fifth voltage level or lower if the unselected word line is not adjacent to the selected word line, the fifth voltage level being lower than the fourth voltage level.

9. The nonvolatile semiconductor memory device of claim 8, wherein the unselected word line control voltage is set to be at a sixth voltage level that is lower than the fifth voltage level if the unselected word line is separated from the selected word line with more than one word line between the unselected word line and the selected word line.

10. The nonvolatile semiconductor memory device of claim 4, wherein an unselected word line control voltage applied to unselected word lines is varied depending on how far the unselected word line is from one of the selected word line and the back gate line.

11. The nonvolatile semiconductor memory device of claim 10, wherein the unselected word line control voltage is set to be at a fourth voltage level if the unselected word line is adjacent to one of the selected word line and the back gate line and a fifth voltage level or lower if the unselected word line is not adjacent to one of the selected word line and the back gate line, the fifth voltage level being lower than the fourth voltage level.

12. A method of controlling voltages applied to word lines and a back gate line in a nonvolatile semiconductor memory device, comprising:
selecting a word line; and
varying voltage levels of a control voltage applied to the back gate line based on how far the selected word line is from the back gate line.

13. The method of claim 12, wherein the control voltage applied to the back gate line is set to be at a first voltage level if the selected word line is adjacent to the back gate line and a second voltage level or lower if the selected word line is not adjacent to the back gate line, the second voltage level being lower than the first voltage level.

14. The method of claim 13, wherein the control voltage applied to the back gate line is set to be at a third voltage level that is lower than the second voltage level if the selected word line is separated from the back gate line with more than one word line between the selected word line and the back gate line.

15. The method of claim 14, further comprising:
varying voltage levels of a control voltage applied to unselected word lines is based on how far the unselected word line is from the selected word line.

16. The method of claim 15, wherein the control voltage applied to the unselected word line is set to be at a fourth voltage level if the unselected word line is adjacent to the selected word line and a fifth voltage level or lower if the unselected word line is not adjacent to the selected word line, the fifth voltage level being lower than the fourth voltage level.

17. The method of claim 16, wherein the control voltage applied to the unselected word line is set to be at a sixth voltage level that is lower than the fifth voltage level if the unselected word line is separated from the selected word line with more than one word line between the unselected word line and the selected word line.

18. The method of claim 12, further comprising:
varying voltage levels of a control voltage applied to unselected word lines is based on how far the unselected word line is from one of the selected word line and the back gate line.

19. The method of claim 18, wherein the control voltage applied to the unselected word line is set to be at a fourth voltage level if the unselected word line is adjacent to one of the selected word line and the back gate line and a fifth voltage level or lower if the unselected word line is not adjacent to one of the selected word line and the back gate line, the fifth voltage level being lower than the fourth voltage level.

20. The method of claim 12, wherein said varying the voltage levels of the control voltage includes generating control voltages of different fixed voltage levels.

* * * * *